(12) United States Patent
Naito

(10) Patent No.: US 11,239,355 B2
(45) Date of Patent: Feb. 1, 2022

(54) SEMICONDUCTOR DEVICE

(71) Applicant: FUJI ELECTRIC CO., LTD., Kanagawa (JP)

(72) Inventor: Tatsuya Naito, Matsumoto (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 32 days.

(21) Appl. No.: 16/589,117

(22) Filed: Sep. 30, 2019

(65) Prior Publication Data

US 2020/0035819 A1 Jan. 30, 2020

Related U.S. Application Data

(63) Continuation of application No. PCT/JP2018/038353, filed on Oct. 15, 2018.

(30) Foreign Application Priority Data

Oct. 18, 2017 (JP) .............................. JP2017-202228

(51) Int. Cl.
*H01L 29/76* (2006.01)
*H01L 29/78* (2006.01)
(Continued)

(52) U.S. Cl.
CPC ............ *H01L 29/78* (2013.01); *H01L 21/822* (2013.01); *H01L 27/06* (2013.01); *H01L 27/088* (2013.01);
(Continued)

(58) Field of Classification Search
CPC ....... H01L 29/78; H01L 21/822; H01L 27/06; H01L 27/088; H01L 29/06;
(Continued)

(56) References Cited

U.S. PATENT DOCUMENTS

2005/0077599 A1 4/2005 Miura
2015/0311285 A1 10/2015 Momota
(Continued)

FOREIGN PATENT DOCUMENTS

JP 2005116962 A 4/2005
JP 2011066371 A 3/2011
(Continued)

OTHER PUBLICATIONS

International Search Report and (ISA/237) Written Opinion of the International Search Authority for International Patent Application No. PCT/JP2018/038353, mailed by the Japan Patent Office dated Dec. 18, 2018.

*Primary Examiner* — Shouxiang Hu

(57) ABSTRACT

A semiconductor device is provided, including: a semiconductor substrate; an active section in which current flows between upper and lower surfaces of the semiconductor substrate; a transistor section provided in the active section; a gate metal layer to supply a gate voltage to the transistor section; a gate pad electrically connected to the gate metal layer; a temperature-sensing unit provided above the active section; a temperature-measurement pad arranged in a peripheral region between the active section and an outermost perimeter of the semiconductor substrate; and a temperature-sensing wire having a longitudinal portion and connecting the temperature-sensing unit and the temperature-measurement pad, wherein on the upper surface of the semiconductor substrate, the gate pad is arranged in a region other than an extending region that is an extension of the longitudinal portion of the temperature-sensing wire to the outermost perimeter of the semiconductor substrate in the longitudinal direction.

11 Claims, 30 Drawing Sheets

(51) Int. Cl.
*H01L 21/822* (2006.01)
*H01L 27/06* (2006.01)
*H01L 27/088* (2006.01)
*H01L 29/06* (2006.01)
*H01L 29/423* (2006.01)
*H01L 29/66* (2006.01)
*H01L 29/739* (2006.01)

(52) U.S. Cl.
CPC .......... *H01L 29/06* (2013.01); *H01L 29/4236* (2013.01); *H01L 29/4238* (2013.01); *H01L 29/66545* (2013.01); *H01L 29/739* (2013.01)

(58) Field of Classification Search
CPC ............. H01L 29/4236; H01L 29/4238; H01L 29/66545; H01L 29/739; H01L 29/42376; H01L 29/1095; H01L 29/404; H01L 29/7397; H01L 29/407; H01L 29/417; H01L 29/0696; H01L 23/34; H01L 27/0629; H01L 27/0727; H01L 29/8613; H01L 2924/13055; H01L 2224/48247
See application file for complete search history.

(56) References Cited

U.S. PATENT DOCUMENTS

| | | | |
|---|---|---|---|
| 2016/0336435 A1* | 11/2016 | Naito | H01L 27/0635 |
| 2017/0111037 A1* | 4/2017 | Shiigi | H01L 29/1608 |
| 2017/0162662 A1 | 6/2017 | Naito | |
| 2017/0236908 A1* | 8/2017 | Naito | H01L 29/4238 257/48 |

FOREIGN PATENT DOCUMENTS

| | | |
|---|---|---|
| JP | 2015207736 A | 11/2015 |
| JP | 2017103400 A | 6/2017 |
| JP | 2017147435 A | 8/2017 |

\* cited by examiner

SEMICONDUCTOR DEVICE

The contents of the following Japanese patent applications are incorporated herein by reference:
NO. 2017-202228 filed in JP on Oct. 18, 2017, and
NO. PCT/JP2018/038353 filed on Oct. 15, 2018.

BACKGROUND

1. Technical Field

The present invention relates to a semiconductor device.

2. Related Art

Conventionally, semiconductor devices such as insulated gate bipolar transistors (IGBTs) are known (see Patent Documents 1 and 2, for example).
Patent Document 1: Japanese Patent Application Publication No. 2017-103400
Patent Document 2: Japanese Patent Application Publication No. 2015-207736
It is preferable to prevent decrease in withstand capability in semiconductor devices.

SUMMARY

An aspect of the present invention provides a semiconductor device including a semiconductor substrate. The semiconductor device may include an active section provided in the semiconductor substrate and in which current flows between upper and lower surfaces of the semiconductor substrate. The semiconductor device may include a transistor section provided in the active section. The semiconductor device may include a gate metal layer electrically connected to the transistor section to supply a gate voltage to the transistor section. The semiconductor device may include a gate pad arranged on the upper surface of the semiconductor substrate and electrically connected to the gate metal layer. The semiconductor device may include a temperature-sensing unit provided on the upper surface of the semiconductor substrate and above the active section. The semiconductor device may include a temperature-measurement pad arranged on the upper surface of the semiconductor substrate and in a peripheral region between the active section and an outermost perimeter of the semiconductor substrate. The semiconductor device may include a temperature-sensing wire having a longitudinal portion extending in a predetermined longitudinal direction on the upper surface of the semiconductor substrate, and connecting the temperature-sensing unit and the temperature-measurement pad. On the upper surface of the semiconductor substrate, the gate pad may be arranged in a region other than an extending region that is an extension of the longitudinal portion of the temperature-sensing wire to the outermost perimeter of the semiconductor substrate in the longitudinal direction.

The gate pad may be arranged in the peripheral region. The semiconductor device may include an inner electrode formed of metal and provided more inside than the gate metal layer. The semiconductor device may include one or more voltage-supplying pads arranged in the peripheral region and electrically connected to the inner electrode. The gate pad and all the voltage-supplying pads may be arranged in a same one of two divided regions into which the peripheral region is halved by the longitudinal portion of the temperature-sensing wire and the extension of the longitudinal portion.

The temperature-measurement pad may be arranged in other one of the two divided regions than the divided region in which the gate pad and the voltage-supplying pads are arranged. The semiconductor device may include a diode section provided in the active section and arrayed alternately with the transistor section in a predetermined array direction on the upper surface of the semiconductor substrate. The semiconductor device may include a dummy gate metal layer electrically connected to the diode section to supply a dummy gate voltage to the diode section.

The gate metal layer may be provided to surround the active section in top view of the semiconductor substrate. The dummy gate metal layer may be provided inside the gate metal layer to surround the active section in top view of the semiconductor substrate.

One of the voltage-supplying pads provided in the same divided region as the gate pad may be a dummy gate pad electrically connected to the dummy gate metal layer. The inner electrode may be an emitter electrode, and one of the voltage-supplying pads provided in the same divided region as the gate pad may be a Kelvin pad electrically connected to the emitter electrode.

The gate metal layer may include an outer gate metal layer arranged in the peripheral region and an inner gate metal layer arranged above the active section and connected to the outer gate metal layer. The semiconductor device may include a gate runner containing a semiconductor material, provided above the semiconductor substrate in the active section, and having a first end connected to the inner gate metal layer and a second end connected to the inner gate metal layer or the outer gate metal layer. The inner electrode may include a first region and a second region separated by the inner gate metal layer and the gate runner in top view of the semiconductor substrate. The inner electrode may include a connecting region connecting the first region and the second region above the gate runner.

The dummy gate metal layer may include an outer dummy gate metal layer arranged in the peripheral region and an inner dummy gate metal layer arranged above the active section and connected to the outer dummy gate metal layer. The semiconductor device may include a dummy gate runner containing a semiconductor material, provided above the semiconductor substrate in the active section, and having a first end connected to the inner dummy gate metal layer and a second end connected to the inner dummy gate metal layer or the outer dummy gate metal layer. The inner electrode may include a first region and a second region separated by the inner dummy gate metal layer and the dummy gate runner in top view of the semiconductor substrate, and a connecting region connecting the first region and the second region above the dummy gate runner.

The longitudinal direction of the temperature-sensing wire may coincide with the array direction. The temperature-sensing unit may be disposed between two transistor sections, each being the transistor section, in top view of the semiconductor substrate.

The semiconductor device may include a gate runner containing a semiconductor material, provided in a region between the active section and the voltage-supplying pads in the peripheral region, and having first and second ends connected to the gate metal layer. In a direction connecting the first and second ends of the gate runner, a width between an end of the gate metal layer to which the first end of the gate runner is connected and an end of the gate metal layer to which the second end of the gate runner is connected may be larger than a width of the gate metal layer connected to the first end of the gate runner.

A part of the gate metal layer may be provided along the temperature-sensing wire.

A second aspect of the present invention provides a semiconductor device including a semiconductor substrate. The semiconductor device may include an active section provided in the semiconductor substrate and in which current flows between upper and lower surfaces of the semiconductor substrate. The semiconductor device may include a transistor section provided in the active section. The semiconductor device may include a gate metal layer electrically connected to the transistor section to supply a gate voltage to the transistor section. The semiconductor device may include a temperature-sensing unit provided on the upper surface of the semiconductor substrate and above the active section. The semiconductor device may include a temperature-measurement pad arranged on the upper surface of the semiconductor substrate and in a peripheral region between the active section and an outermost perimeter of the semiconductor substrate. The semiconductor device may include a temperature-sensing wire having a longitudinal portion extending in a predetermined longitudinal direction on the upper surface of the semiconductor substrate, and connecting the temperature-sensing unit and the temperature-measurement pad. A part of the gate metal layer may be provided along the temperature-sensing wire.

The summary clause does not necessarily describe all necessary features of the embodiments of the present invention. The present invention may also be a sub-combination of the features described above.

BRIEF DESCRIPTION OF THE DRAWINGS

FIG. 1c illustrates the respective widths of components on the upper surface of the semiconductor substrate and the like.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

In this specification, one side in a direction parallel to the depth direction of a semiconductor substrate is referred to as an "upper" side, and the other side is referred to as a "lower" side. One of two principal surfaces of a substrate, layer or some other member is referred to as an upper surface, and the other surface is referred to as a lower surface. The "upper" and "lower" directions are not limited by the direction of gravity or the orientation of the semiconductor device mounted on a board or the like.

In this specification, technical matters may be described using orthogonal coordinate axes of X axis, Y axis and Z axis. In this specification, a plane parallel to the upper surface of a semiconductor substrate is referred to as an X-Y plane, and the depth direction of the semiconductor substrate is referred to as the Z-axis direction.

While in the following embodiment examples, first and second conductivity types are defined as N and P types, respectively, the first and second conductivity types may be P and N types, respectively. In this case, the conductivity type of substrates, layers, regions and the like in the embodiment examples would be of the opposite polarity.

Figure 1A:
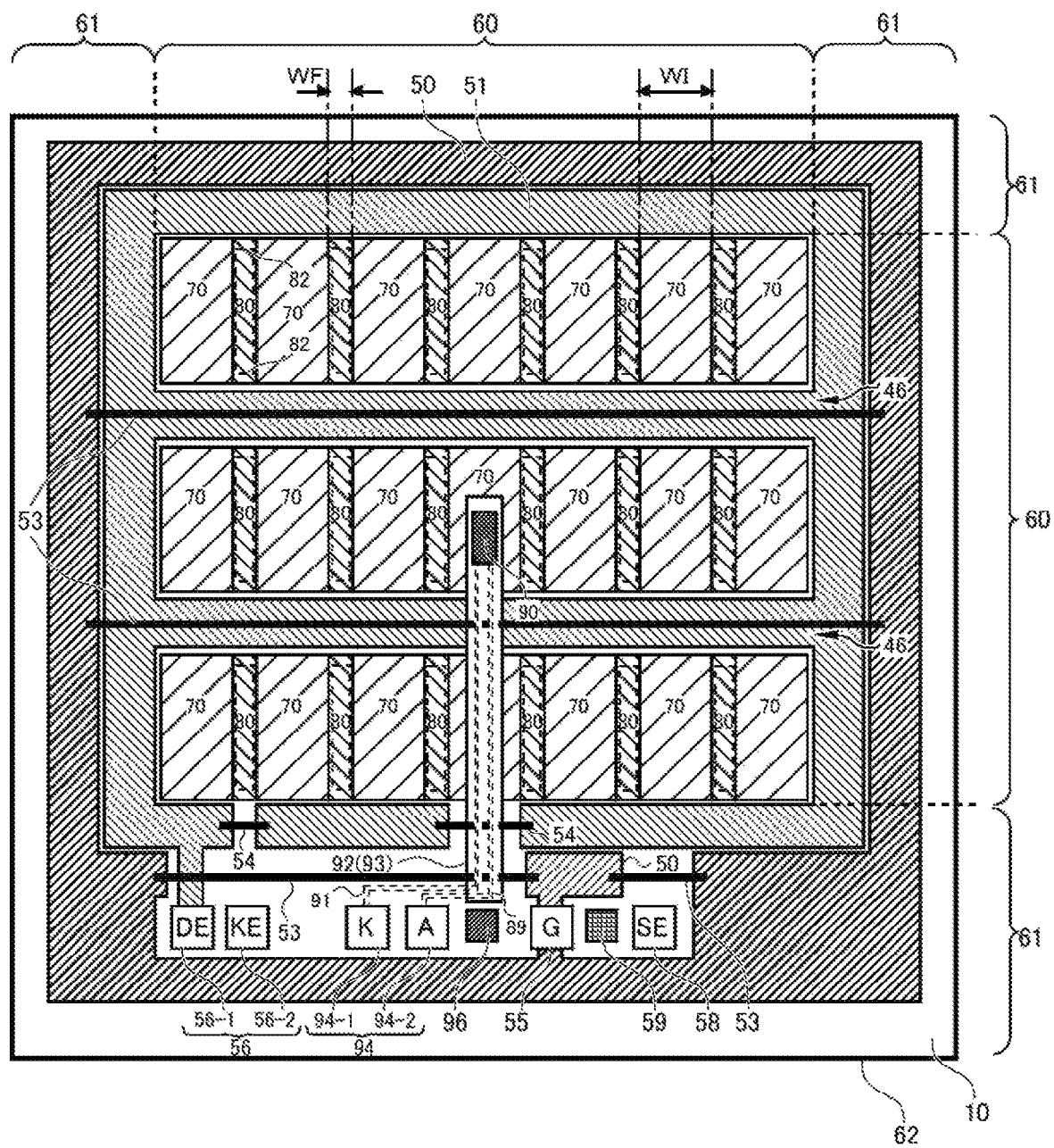
FIG. 1a shows an example of the upper surface of a semiconductor device 100 according to the present embodiment.

FIG. 1a shows an example of an upper surface of a semiconductor device 100 according to the present embodiment. In the present example, the semiconductor device 100 is a semiconductor chip including one or more transistor sections 70 and one or more diode sections 80. The transistor sections 70 include transistors such as IGBTs. The diode sections 80 include diodes such as FWDs (Free Wheel Diodes).

The semiconductor device 100 is a vertical-type device in which current flows between the upper and lower surfaces of a semiconductor substrate 10. An example structure of the transistor sections 70 and the diode sections 80 will be described with reference to FIG. 1e.

As shown in FIG. 1a, the semiconductor substrate 10 includes an active section 60. The active section 60 is a region in which main current flows between the upper and lower surfaces of the semiconductor substrate 10 when the semiconductor device 100 is controlled into the ON state. That is, the active section 60 is a region in which current flows inside the semiconductor substrate 10 in the depth direction of the semiconductor substrate 10, from the upper surface to the lower surface or from the lower surface to the upper surface of the semiconductor substrate 10. In this specification, each of the transistor sections 70 and the diode sections 80 may be referred to as a device section or device region. The active section 60 may be defined as a region in which device sections are provided. Note that the active section 60 also includes a region disposed between two device sections in top view of the semiconductor substrate 10. In the example of FIG. 1a, the active section 60 also includes regions disposed between device sections and in which a dummy gate metal layer 51 is provided. In top view of the semiconductor substrate 10, the active section 60 may include a region in which an emitter electrode is provided and a region disposed between portions of the emitter electrode. In the example of FIG. 1a, the emitter electrode is provided above the transistor sections 70 and the diode sections 80.

In top view of the semiconductor substrate 10, a peripheral region 61 is defined as a region between the active section 60 and an outermost perimeter 62 of the semiconductor substrate 10. The peripheral region 61 is provided to surround the active section 60 in top view of the semiconductor substrate 10. One or more metal pads for connecting the semiconductor device 100 and an external device to each other with a wire or the like may be arranged in the peripheral region 61. In the semiconductor device 100, the peripheral region 61 may include an edge termination structure surrounding the active section 60. The edge termination structure relaxes the concentration of electric fields near the upper surface the semiconductor substrate 10. The edge termination structure includes, for example, a guard ring, a field plate or a RESURF structure, or combinations thereof.

A plurality of transistor sections 70 and a plurality of diode sections 80 may be provided in the active section 60. In each diode section 80, an N+ cathode region 82 is provided on the lower surface of the semiconductor substrate. The cathode region 82 may be provided over a region not in contact with the peripheral region 61, as shown in FIG. 1a with a dotted frame. In the present example, the cathode region 82 is provided over a region not in contact with a gate metal layer 50 and a dummy gate metal layer 51, which will be described later. The transistor sections 70 and the diode sections 80 may be provided alternately in the Y-axis direction. In this specification, the direction in which the transistor sections 70 and the diode sections 80 are alternately arrayed is referred to as an array direction (Y-axis direction). Transistor sections 70 may be provided at both ends of the active section 60 along the Y-axis direction. A plurality of transistor sections 70 and a plurality of diode sections 80 may be provided along the X-axis direction. In the example of FIG. 1a, a plurality of transistor sections 70 are arranged along the X-axis direction and a plurality of diode sections 80 are arranged along the X-axis direction. In another example, diode sections 80 may be provided at positions overlapping with transistor sections 70 in the X-axis direction. FIG. 1a shows an example in which the number of transistor sections 70 provided is seven in the Y-axis direction and three in the X-axis direction, and the number of diode sections 80 provided is six in the Y-axis direction and three in the X-axis direction.

In the present example, a dividing portion 46 is provided in the active section 60. The dividing portion 46 is a region that divides the active section 60 in top view of the semiconductor substrate 10. In the present example, the dividing portion 46 divides the active section 60 into a plurality of regions in the X-axis direction. The dividing portion 46 may divide the emitter electrode in top view of the semiconductor substrate 10. The dividing portion 46 may be a region having a width in the X-axis direction. In the present example, a dummy gate metal layer 51 and a gate runner 53 are provided in the dividing portion 46.

Each region of the active section 60 divided by the dividing portion 46 may include a plurality of transistor sections 70 and a plurality of diode sections 80 provided along the Y-axis direction. In the example shown in FIG. 1a, two dividing portions 46 are provided at different positions in the X-axis direction. In this case, the dividing portions 46 divide the active section 60 into three regions in the X-axis direction.

The gate metal layer 50 may be provided to surround the active section 60 in top view of the semiconductor substrate 10. The gate metal layer 50 is electrically connected to a gate pad 55 provided outside the active section 60. The gate metal layer 50 may be formed along the outermost perimeter 62 of the semiconductor substrate 10. The gate pad 55 may be arranged between the gate metal layer 50 and the active section 60.

The gate metal layer 50 may be formed of aluminum or an aluminum-silicon alloy. The gate metal layer 50 is electrically connected to the transistor sections 70 to supply gate voltages to the transistor sections 70.

The gate runner 53 is electrically connected to the gate metal layer 50, and extends to a position above the active section 60. The gate runner 53 electrically connects the gate metal layer 50 to a conductive portion formed of polysilicon or the like and provided in the trench of a gate trench portion 40 (refer to FIG. 1e) in the transistor sections 70.

The gate runner 53 is formed of a conductive material such as polysilicon. The gate runner 53 has a higher resistivity than the gate metal layer 50. If the gate metal layer 50 is formed of aluminum and the gate runner 53 is formed of polysilicon, the resistivity of the gate runner 53 is higher than the resistivity of the gate metal layer 50 by two orders of magnitude.

A temperature-sensing unit 90 is provided above the active section 60. The temperature-sensing unit 90 may be provided at the center of the active section 60 in top view of the semiconductor substrate 10. The temperature-sensing unit 90 senses the temperature of the active section 60. The temperature-sensing unit 90 may be a temperature-sensing p-n diode formed of monocrystalline or polycrystalline silicon.

A temperature-sensing wire 92 is provided above the active section 60 in top view of the semiconductor substrate 10. The temperature-sensing wire 92 is connected to the temperature-sensing unit 90. The temperature-sensing wire 92 extends from the temperature-sensing unit 90 to the peripheral region 61 in a predetermined direction. The temperature-sensing wire 92 is connected to a temperature-measurement pad 94 provided in the peripheral region 61. The temperature-sensing wire 92 may include a wire 89 for an anode electrode to electrically connect to the p type layer of the temperature-sensing p-n diode and a wire 91 for a cathode electrode to electrically connect to the n type layer thereof. While the temperature-sensing wire 92 is indicated by rectangular solid lines in FIG. 1a and other figures, the temperature-sensing wire 92 may be arranged as the wire 89 and the wire 91 shown with dotted lines in FIG. 1a. The wire 89 and the wire 91 represent an example of the specific manner of routing of the temperature-sensing wire 92.

The temperature-sensing wire 92 has a longitudinal portion 93 extending in a predetermined longitudinal direction (the X-axis direction in the present example). The longitudinal direction of the temperature-sensing wire 92 is the direction of extension of the longest one of one or more linear portions provided from the temperature-sensing unit 90 toward the peripheral region 61. A linear portion refers to a portion formed with a straight-line shape in a plane parallel to the upper surface of the semiconductor substrate 10. In FIG. 1a, the temperature-sensing wire 92 is shown only with the longitudinal portion 93, and the other portions are omitted. The longitudinal portion 93 may be a linear portion of the temperature-sensing wire 92 extending from the temperature-sensing unit 90. The longitudinal portion 93 of the temperature-sensing wire 92 may be provided at the center of the active section 60 in the Y-axis direction.

The temperature-measurement pad 94 includes a temperature-measurement cathode pad 94-1 and a temperature-measurement anode pad 94-2. Current flows from the temperature-measurement cathode pad 94-1 to the temperature-sensing unit 90 through the temperature-sensing wire 92. The temperature-sensing unit 90 outputs a current based on a temperature-sensing result, and the current flows through the temperature-sensing wire 92 and is input to the temperature-measurement anode pad 94-2. A sensor 96 is provided as a backup of the temperature-sensing unit 90. In the present example, the sensor 96 is provided in the peripheral region 61. The sensor 96 may be a p-n junction diode formed of polysilicon or the like.

In the present example, the gate metal layer 50 has portions arranged at both ends of the semiconductor substrate 10 in the Y-axis direction and extending in the X-axis direction. In the present example, the gate runner 53 traverses a region above the active section 60, and connects two portions of the gate metal layer 50 extending in the X-axis direction. The gate runner 53 may be arranged in the dividing portion 46. An additional gate runner 53 may be provided in the peripheral region 61 between a pad such as the gate pad 55 and the active section 60. The gate runner 53 may be arranged in a region disposed between portions of the gate metal layer 50 e.g. in the Y-axis direction. The gate metal layer 50 may not be provided in this region, in which other components such as the emitter electrode, the dummy gate metal layer 51 and the temperature-sensing wire 92 are provided. In this region, the gate runner 53 may be arranged above or below the layer of the emitter electrode, the dummy gate metal layer 51 and the temperature-sensing wire 92. Note that an insulation layer is provided between the gate runner 53 and the layer of those components. The gate runner 53 may be arranged to connect the two portions of the gate metal layer 50 arranged at both ends of the region in which the emitter electrode, the dummy gate metal layer 51 and the temperature-sensing wire 92 are provided. In top view of the semiconductor substrate 10, the gate runner 53 provided in the peripheral region 61 may cross the temperature-sensing wire 92. This gate runner 53 is provided to pass through a region below the temperature-sensing wire 92 in the Y-axis direction. Both ends of this gate runner 53 are connected to the gate metal layer 50.

In top view of the semiconductor substrate 10, the dummy gate metal layer 51 may be provided on the inside of the gate metal layer 50 to surround the active section 60. The dummy gate metal layer 51 may also be provided in the dividing portion 46. The dummy gate metal layer 51 is an example of an inner electrode arranged more inside than the gate metal layer 50 in top view of the semiconductor substrate 10.

The semiconductor device 100 includes one or more voltage-supplying pads 56 electrically connected to the inner electrode on the upper surface of the semiconductor substrate 10. The voltage-supplying pad 56 is provided in the peripheral region 61. The voltage-supplying pad 56 may be connected to the inner electrode through a metal material provided on the upper surface of the semiconductor substrate 10. In the present example, the voltage-supplying pad 56 includes a dummy gate pad 56-1. The dummy gate pad 56-1 is electrically connected to the dummy gate metal layer 51. The dummy gate pad 56-1 may be in contact with the dummy gate metal layer 51.

The dummy gate metal layer 51 may be formed of aluminum or an aluminum-silicon alloy. The dummy gate metal layer 51 is electrically connected to the diode sections 80 to supply a dummy gate voltage to a conductive portion of a dummy trench portion 30 in the diode sections 80. The dummy gate metal layer 51 may also supply the dummy gate voltage to a dummy trench portion 30 in the transistor sections 70. A screening test can be conducted to test the insulation property of an insulating film 42 by applying the dummy gate voltage to the conductive portion of the dummy trench portion 30.

A dummy gate runner 54 connects portions of the dummy gate metal layer 51 to each other. The dummy gate runner 54 is formed of a conductive material such as polysilicon doped with impurities, for example. In top view of the semiconductor substrate 10, the dummy gate runner 54 may be provided outside the active section 60 and between the gate pad 55 and the active section 60 in the X-axis direction. The dummy gate runner 54 may be arranged in a region disposed between portions of the dummy gate metal layer 51 e.g. in the Y-axis direction. The dummy gate metal layer 51 may not be provided in this region, in which other components such as the emitter electrode, the gate metal layer 50 and the temperature-sensing wire 92 are provided. In this region, the dummy gate runner 54 may be arranged above or below the layer of the emitter electrode, the gate metal layer 50 and the temperature-sensing wire 92. Note that an insulation layer is provided between the dummy gate runner 54 and the layer of those components. The dummy gate runner 54 may be arranged to connect the two portions of the dummy gate metal layer 51 arranged at both ends of the region in which the emitter electrode, the gate metal layer 50 and the temperature-sensing wire 92 are provided.

A current sensing unit 59 senses current flowing in the gate pad 55. A current sensing pad 58 is a pad for measuring a current flowing in the current sensing unit 59.

In the present example, the voltage-supplying pad 56 further include a Kelvin pad 56-2. The Kelvin pad 56-2 is connected to the emitter electrode provided above the active section 60 in top view of the semiconductor substrate 10.

Figure 1B:
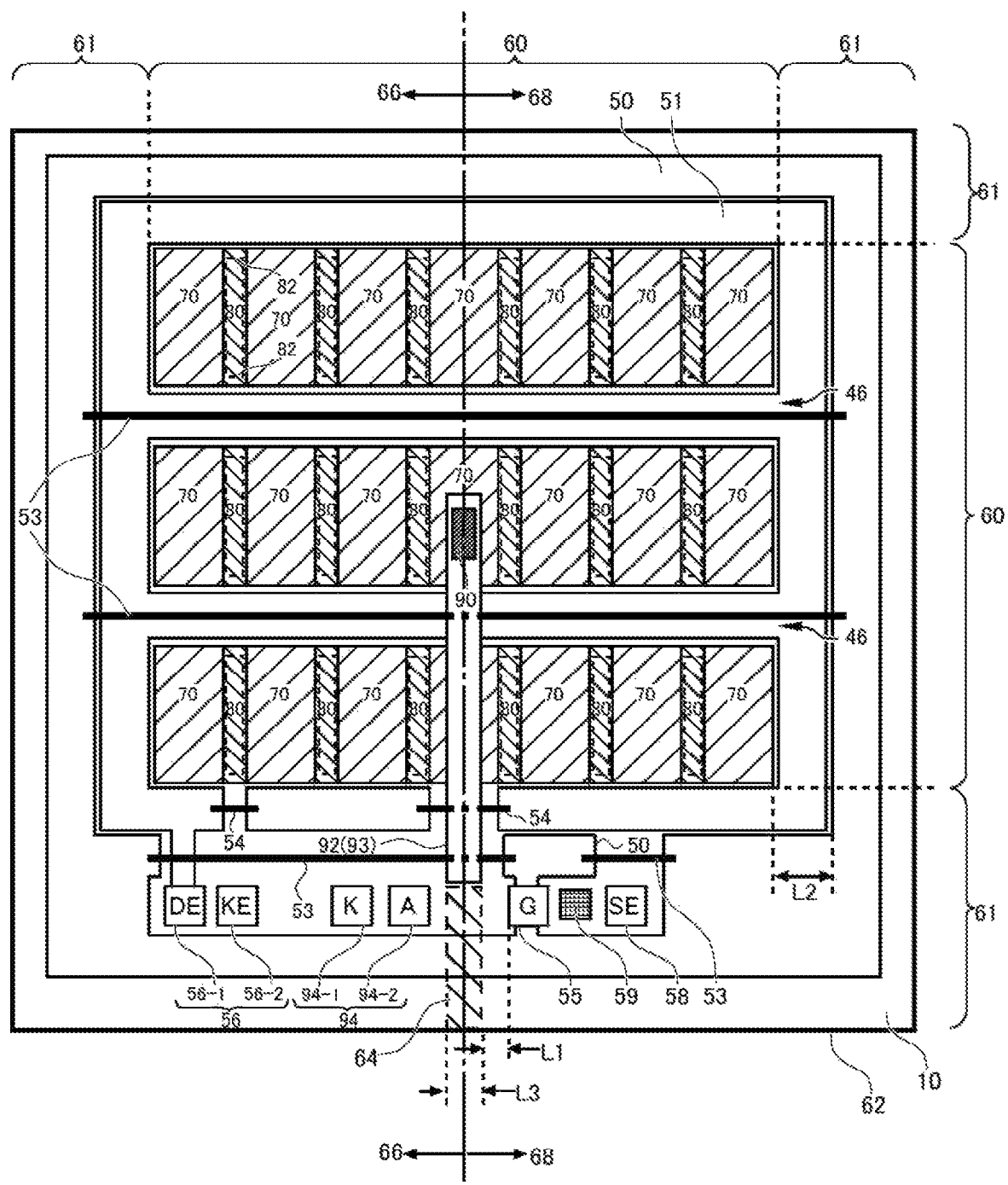
FIG. 1b illustrates the arrangement of a gate pad 55.

FIG. 1b illustrates the arrangement of the gate pad 55. In FIG. 1b, the gate metal layer 50 and the dummy gate metal layer 51 are not hatched. Also, the sensor 96 is not shown in FIG. 1b. In the present example, the gate pad 55 is arranged in the peripheral region 61 on the upper surface of the semiconductor substrate 10. The gate pad 55 may be provided between the gate metal layer 50 and the active section 60 in the X-axis direction.

The gate pad 55 is arranged in a region other than an extending region 64, which is an extension of the longitudinal portion 93 of the temperature-sensing wire 92 to the outermost perimeter 62 of the semiconductor substrate 10 in the longitudinal direction of the temperature-sensing wire 92 (the X-axis direction in the present example). The width of the extending region 64 in the lateral direction, a direction perpendicular to the longitudinal direction (the Y-axis direction in the present example), is equal to the width of the longitudinal portion 93 in the Y-axis direction. The gate pad 55 does not, even partially, overlap the extending region 64.

The distance, L1, between the extending region 64 of the temperature-sensing wire 92 and the gate pad 55 may be larger than or equal to the spacing distance, L2, between the emitter electrode and the gate metal layer 50 (which, in FIG. 1b, is equal to the spacing distance between the active section 60 and the gate metal layer 50). The distances L1 and L2 may each be a distance in the lateral direction of the extending region 64 (the Y-axis direction in the present example). The distance L1 may be larger than or equal to the width, L3, of the temperature-sensing wire 92 in the lateral direction. The distance L1 may be smaller than or equal to length Wh', which will be described later.

The dummy gate pad 56-1 may be provided opposite the gate pad 55 with respect to the longitudinal axis of the temperature-sensing wire 92. That is, the dummy gate pad 56-1 and the gate pad 55 may be provided in two different divided regions (a first divided region 66 and a second divided region 68) into which the peripheral region 61 is halved by the longitudinal portion 93 of the temperature-sensing wire 92 and its extension. The boundary line of the two divided regions is a line that passes through the center of the width of the longitudinal portion 93 of the temperature-sensing wire 92 (in the Y-axis direction in the present example) and is parallel to the longitudinal direction of the temperature-sensing wire 92 (the X-axis direction in the present example). However, all voltage-supplying pads 56 and the gate pad 55 may be arranged in a same divided region, as will be described later.

The gate pad 55 and the voltage-supplying pad 56 may be arranged in any one of the portions of the peripheral region 61, each of which portions corresponds to one of the four sides of the semiconductor substrate 10 in top view. The gate pad 55 and the temperature-measurement pad 94 may be arranged in any one of the portions of the peripheral region 61, each of which portions corresponds to one of the four sides of the semiconductor substrate 10 in top view. The temperature-measurement pad 94 may be provided in a divided region that is different from that in which the gate pad 55 is provided (the first divided region 66 in the present example).

Figure 1C:
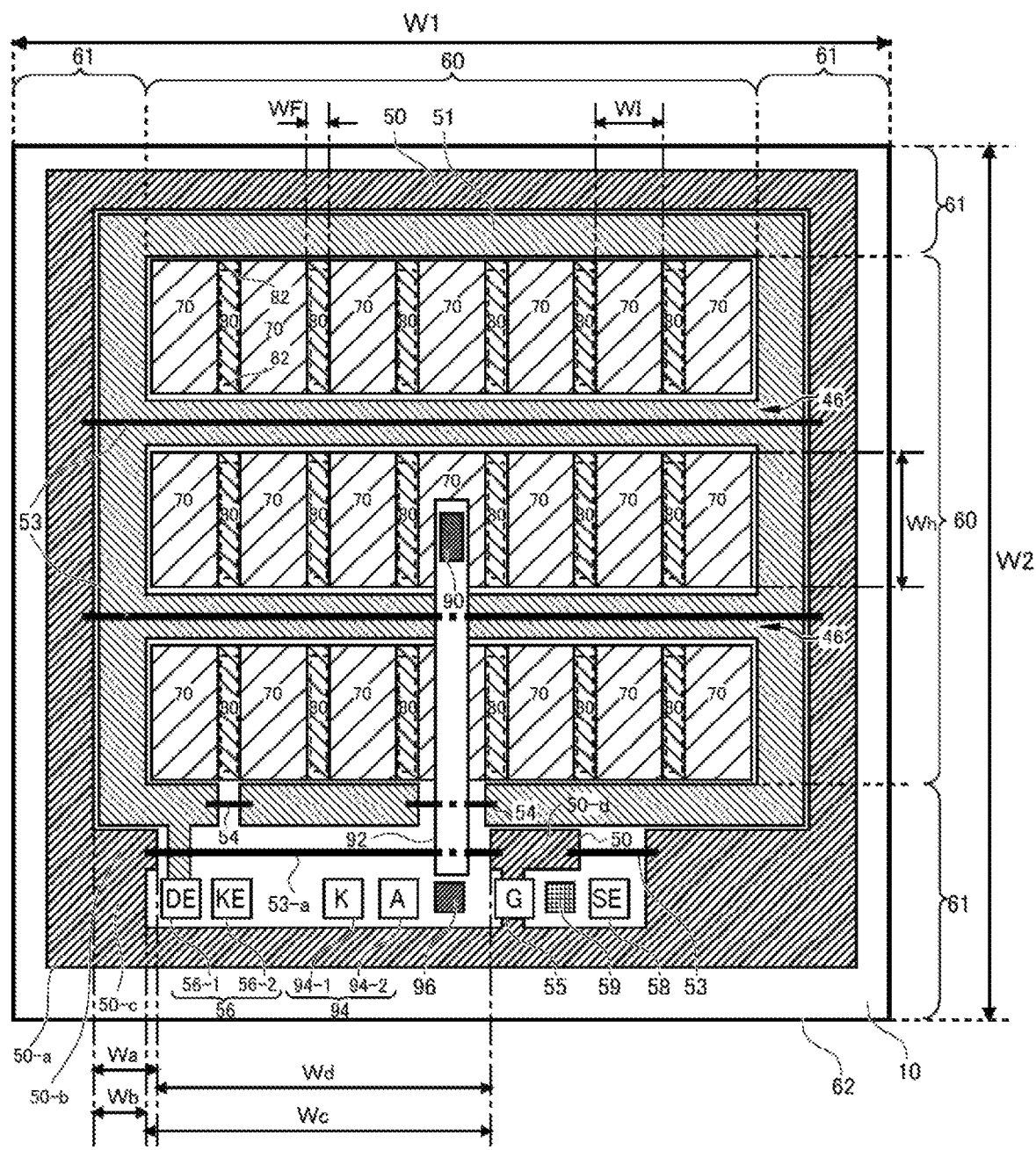

FIG. 1c illustrates the respective widths of components on the upper surface of the semiconductor substrate 10 and the like. Width W1 is the Y-axis direction width of the chip constituting the semiconductor device 100. Width W2 is the X-axis direction width of the chip constituting the semiconductor device 100. Width W1 and width W2 may be equal to each other. As an example, width W1 and width W2 are each 15 mm.

Width WI is the Y-axis direction width of each transistor section 70. Width WF is the Y-axis direction width of each diode section 80. Width Wh is the X-axis direction width of each of the transistor sections 70 and diode sections 80. Width WI may be two times or more and five times or less width WF. Width Wh may be 1.5 times or more and three times or less width WI. As an example, the width WI is 1500 µm. As an example, the width WF is 500 µm. As an example, the width Wh is 3100 µm.

The gate metal layer 50 includes a portion 50-a extending in the X-axis direction along an end side of the semiconductor substrate 10 and a portion 50-b protruding from the portion 50-a in the Y-axis direction. The portion 50-a has a constant width in the Y-axis direction. The portion 50-b is a region to which a gate runner 53-a, which is arranged between the active section 60 and the Kelvin pad 56-2, is connected. The portion 50-b is arranged in the peripheral region 61. Width Wa is defined as the Y-axis direction width of the portion 50-b. That is, width Wa is the difference of the constant width of the portion 50-a from the Y-axis direction width of the portion of the gate metal layer 50 to which the gate runner 53-a is connected.

The gate metal layer 50 includes a portion 50-c protruding from the portion 50-a in the Y-axis direction. The portion 50-c is arranged adjacent to a certain pad in the Y-axis direction. That is, the portion 50-c is a region that protrudes from the portion 50-a toward the certain pad (the dummy gate pad 56-1 in the present example) in the Y-axis direction. The portion 50-c is arranged in the peripheral region 61. The portion 50-c may be continuous with the portion 50-b in the X-axis direction. Width Wb is the width of the portion 50-c in the array direction. That is, width Wb is the difference of the constant width of the portion 50-a from the Y-axis direction width of the portion of the gate metal layer 50 that is adjacent to the certain pad in the Y-axis direction.

The gate metal layer 50 includes a portion 50-d arranged in the peripheral region 61 between the active section 60 and the gate pad 55. The portion 50-d is connected to the gate pad 55. Also, the portion 50-d is separated from the other portions of the gate metal layer 50. In the present example, the portion 50-d is connected to the portion 50-b via the gate runner 53-a. Width Wc is the Y-axis direction distance between the portion 50-c and the portion 50-d of the gate metal layer 50.

Width Wd is the Y-axis direction distance between the portion 50-b and the portion 50-d of the gate metal layer 50. In the present example, width Wd<width Wc. That is, the portion 50-b of the gate metal layer 50 protrudes from the portion 50-c toward the portion 50-d.

In the semiconductor device 100 of the present example, width Wa may be 1.2 times or more and 1.5 times or less width Wb. Width Wd may be 1.5 times or more and 2.5 times or less width Wa (Wd>Wa). Width Wc may be 2.5 times or more and 3.5 times or less width Wb. In the present example, width Wb<width Wd.

In the semiconductor device 100 of the present example, width Wa is 2410 µm, as an example. As an example, width Wb is 1770 µm. As an example, width Wc is 5130 µm. As an example, width Wd is 4490 µm.

In the semiconductor device 100 of the present example, the gate pad 55 is arranged at a position out of the extending region 64 as shown in FIG. 1b. In this manner, the gate metal layer 50, which has a lower resistance than the gate runner 53, can be arranged between the gate pad 55 and the active section 60. Thus, the gate voltages supplied to the transistor sections 70 can be more uniformed. This can prevent decrease in the turn-off withstand capability of the transistor sections 70.

Figure 1D:
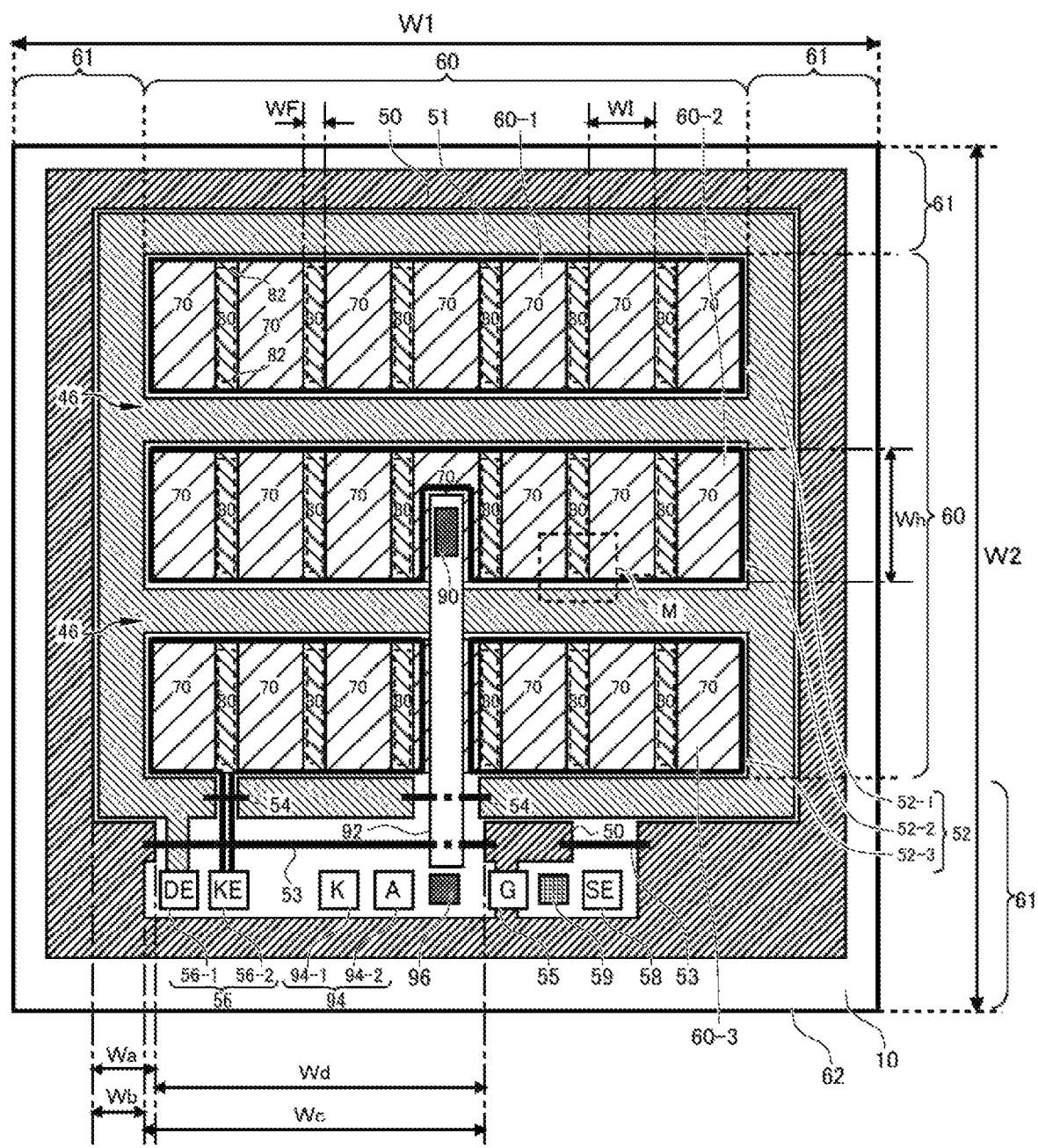
FIG. 1d shows another view of FIG. 1a in which an emitter electrode 52 is added.

FIG. 1d shows another view of FIG. 1a in which the emitter electrode 52 is added. In FIG. 1d, regions in which the emitter electrode 52 is formed are enclosed with thick lines. FIG. 1d omits a part of the gate runner 53 shown in FIG. 1a. In the present example, the active section 60 is divided by the dividing portion 46 into a plurality of regions. In the present example, the active section 60 includes a first region 60-1, a second region 60-2 and a third region 60-3. In the present example, the first region 60-1 is farthest from the gate pad 55 in the X-axis direction, the third region 60-3 is closest to the gate pad 55 in the X-axis direction, and the second region 60-2 is arranged between the first region 60-1 and the second region 60-2.

The emitter electrode 52 is divided by the dividing portion 46 into a plurality of regions. The individual regions of the emitter electrode 52 may be connected to each other by a plated layer, a wire or the like formed above the emitter electrode 52. In the present example, the emitter electrode 52 includes a first region 52-1, a second region 52-2 and a third region 52-3. The first region 52-1 is arranged above the first region 60-1 of the active section 60, the second region 52-2 is arranged above the second region 60-2 of the active section 60, and the third region 52-3 is arranged above the third region 60-3 of the active section 60. As shown in FIG. 1d, in each region of the active section 60, the emitter electrode 52 is provided above the transistor sections 70 and the diode sections 80.

The second region 60-2 of the active section 60 includes the temperature-sensing unit 90 and the temperature-sensing wire 92. The temperature-sensing unit 90 and the temperature-sensing wire 92 may be arranged at the Y-axis direction center of the second region 60-2. The second region 52-2 of the emitter electrode 52 is separated from the temperature-sensing unit 90 and the temperature-sensing wire 92 in top view. The second region 52-2 of the emitter electrode 52 may be arranged along the periphery of the temperature-sensing unit 90 and the temperature-sensing wire 92. An interlayer dielectric film 38 may be provided between the second region 52-2 and each of the temperature-sensing unit 90 and the temperature-sensing wire 92.

The third region 52-3 of the emitter electrode 52 is electrically connected to the Kelvin pad 56-2, which is provided outside the active section 60. In the present example, the third region 52-3 includes a portion extending to the Kelvin pad 56-2. The Kelvin pad 56-2 represents an example of the voltage-supplying pad 56. The third region 60-3 of the active section 60 is divided by the temperature-sensing wire 92 in the Y-axis direction. The third region 52-3 of the emitter electrode 52 may also be divided by the temperature-sensing wire 92. The third region 52-3 of the emitter electrode 52 is separated from the temperature-sensing unit 90 and the temperature-sensing wire 92. If, similarly, any of the gate metal layer 50 or the dummy gate metal layer 51 is divided by the temperature-sensing unit 90 and the temperature-sensing wire 92, the gate metal layer 50 and the dummy gate metal layer 51 are separated from the temperature-sensing unit 90 and the temperature-sensing wire 92.

Figure 1E:
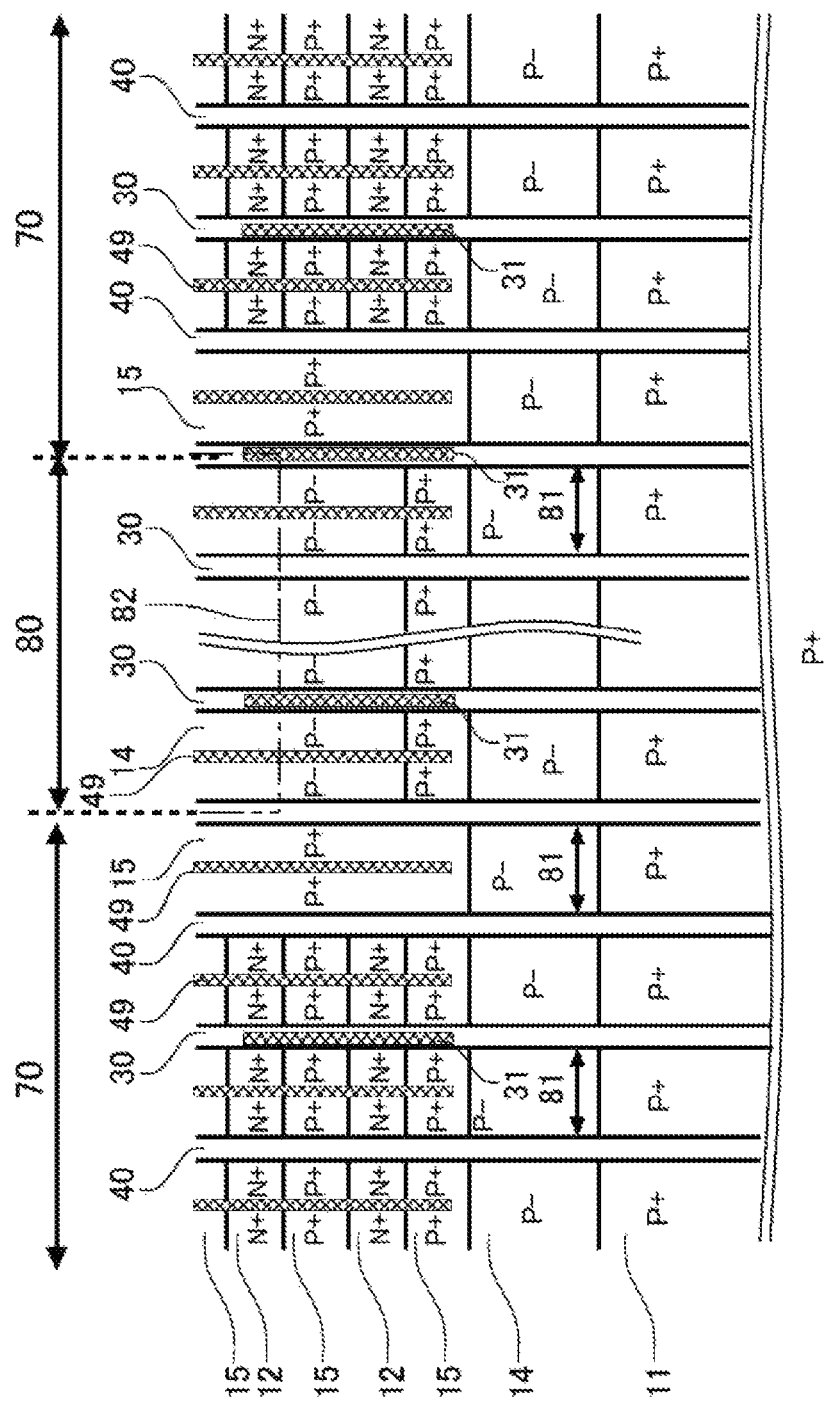
FIG. 1e is a top view showing an example structure of transistor sections 70 and diode sections 80.

FIG. 1e is a top view showing an example structure of the transistor sections 70 and the diode sections 80. FIG. 1e shows transistor sections 70 and diode sections 80 near the dividing portion 46. As an example, FIG. 1e corresponds to region M from FIG. 1d.

Note that an N+ type cathode region 82 is selectively formed in a region in contact with the lower surface of the semiconductor substrate 10. A P+ type collector region 22 (refer to FIG. 4e, for example) is provided in a lower-surface side region in which the cathode region 82 is not formed. A plurality of cathode regions 82 surrounded by the collector region 22 may be arranged on the lower surface of the semiconductor substrate 10. Each transistor section 70 may be a region of the active section 60 in which the collector region 22 is projected perpendicularly to the upper surface of the semiconductor substrate 10 and in which predetermined unit structures including emitter regions 12, contact regions 15 and trench portions are regularly arranged.

Each diode section 80 may be a region of the active section 60 in which the cathode region 82 is projected perpendicularly to the upper surface of the semiconductor substrate 10. In FIG. 1e, the cathode region 82 is indicated with dot-dash lines. The cathode region 82 may be positioned more inside (at a more positive position in the X-axis direction) than the end of contact holes 49 that is closer to the dividing portion 46 (at a more negative position in the X-axis direction).

Each of the transistor sections 70 and the diode sections 80 may include a mesa portion 81 and a plurality of trench portions. The mesa portion 81 is a partial region of the semiconductor substrate 10 provided between two adjacent trench portions. The mesa portion 81 is a part of the semiconductor substrate 10 positioned closer to the upper surface of the semiconductor substrate 10 than the bottom of the trench portions. In this specification, a gate trench portion 40 and a dummy trench portion 30 may be collectively referred to as a trench portion. Each of the gate trench portions 40 and dummy trench portions 30 includes: an insulating film 42 that is an oxide film or the like and is formed on the inner wall of the trench; and a conductive portion 44 that is formed of polysilicon or the like and is covered by the insulating film inside the trench, similar to a trench-type gate runner 53 shown in FIG. 5d.

In the present example, each transistor section 70 includes one or more gate trench portions 40 and one or more dummy trench portions 30. The gate trench portions 40 and the dummy trench portions 30 in the transistor sections 70 may extend in the X-axis direction and be provided alternately in the Y-axis direction.

In the present example, each diode section 80 includes no gate trench portion 40 and one or more dummy trench portions 30. The dummy trench portions 30 in each diode section 80 may also extend in the X-axis direction, and may be a plurality of dummy trench portions 30 provided along the Y-axis direction. Each trench portion may or may not reach the dividing portion 46. The trench portions shown in FIG. 1e do not reach the dividing portion 46. Each trench portion may have a U-shaped end, similar to a dummy trench portion 30 shown in FIG. 4c.

The conductive portion 44 of each dummy trench portion 30 is electrically connected to the emitter electrode through a contact hole 31 provided in the interlayer dielectric film. The conductive portion 44 of each gate trench portion 40 is electrically connected to the gate runner 53 or the gate metal layer 50 through a contact hole 76 (refer to FIG. 5b, for example) provided in the interlayer dielectric film.

In each transistor section 70, the semiconductor substrate 10 may include an N+ type emitter region 12, a P+ type contact region 15, a P− type base region 14 and a P+ type well region 11. The emitter region 12, the contact region 15, the base region 14 and the well region 11 may each be provided from the upper surface of the semiconductor substrate 10 to a predetermined depth. Each mesa portion 81 of the transistor sections 70 may include one or more emitter regions 12 and one or more contact regions 15 provided alternately in the X-axis direction. However, the mesa portion 81 positioned at a Y-axis direction end of the transistor section 70 may include no emitter region 12.

In the present example, the characters "N" and "P" indicate that the majority carrier is electron and hole, respectively. Regarding the signs "+" and "−" on the characters "N" and "P", "+" indicates a higher concentration of carriers than that without it, and "−" indicates a lower concentration of carriers than that without it.

In each mesa portion 81 of the transistor sections 70, the base region 14 may be provided below the emitter region 12 and the contact region 15. In top view, the base region 14 may be provided at both X-axis direction ends of the region in which the emitter regions 12 and the contact regions 15 are provided alternately in the X-axis direction. In contrast, in the mesa portion 81 positioned at the boundary between a transistor section 70 and a diode section 80, the base region 14 is provided below the contact region 15. In top view, the base region 14 may be provided at both X-axis direction ends of the contact region 15. The well region 11 may be provided between two device regions such as transistor sections 70 adjacent in the X-axis direction.

The emitter electrode may be electrically connected to the emitter region 12 and the contact region 15 via a contact hole 49 provided in the interlayer dielectric film. The emitter electrode may also be electrically connected, via the contact hole 49, to the contact region 15 of the mesa portion 81 positioned at the boundary between a transistor section 70 and a diode section 80.

In each diode section 80, the semiconductor substrate 10 may include a contact region 15, a base region 14 and a well region 11. The contact region 15, the base region 14 and the well region 11 may be provided from the upper surface of the semiconductor substrate 10 to the inside of the semiconductor substrate 10. Each mesa portion 81 of the diode sections 80 may include one or more base regions 14 and one or more contact regions 15 provided alternately in the X-axis direction.

In each mesa portion 81 of the diode sections 80, the contact region 15 may be formed only at both X-axis direction ends of the contact hole 49, which is formed on the upper surface of the base region 14. Alternatively, one or more contact regions 15 may be provided alternately with one or more base regions 14 in the X-axis direction. The base region 14 may also be provided below the contact region 15. The base region 14 may also be arranged at both X-axis direction ends of the region in which the base regions 14 and the contact regions 15 are provided alternately in the X-axis direction. The well region 11 may be provided between two diode sections 80 adjacent in the X-axis direction. The emitter electrode may be electrically connected to the base region 14 and the contact region 15 via the contact hole 49.

As described above, each transistor section 70 is a region in which the P type collector region 22 (refer to FIG. 4e, for example) is provided on the lower surface of the semiconductor substrate 10, and in which the N type emitter region 12 and the like are provided regularly on the upper surface the semiconductor substrate 10. The collector region 22 is connected to a collector electrode 24 (refer to FIG. 4e, for example) formed on the lower surface of the semiconductor substrate 10, and the emitter region 12 is connected to the emitter electrode 52 (refer to FIG. 4c, for example) formed on the upper surface of the semiconductor substrate 10. The emitter electrode represents an example of the inner electrode arranged more inside than the gate metal layer 50 in top view of the semiconductor substrate 10.

Figure 4A:
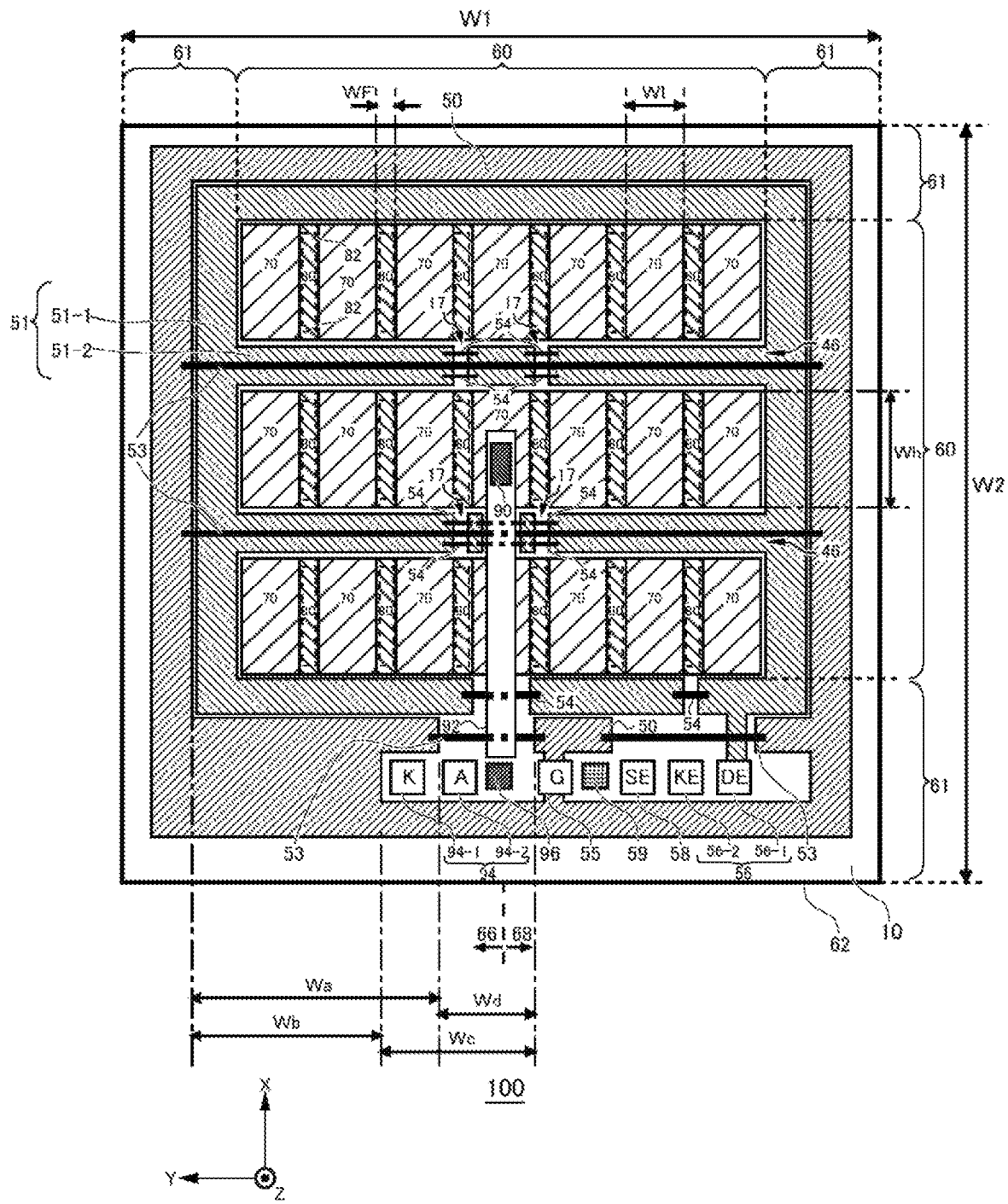
FIG. 4a shows another example of the upper surface of the semiconductor device 100 according to the present embodiment.
Figure 4B:
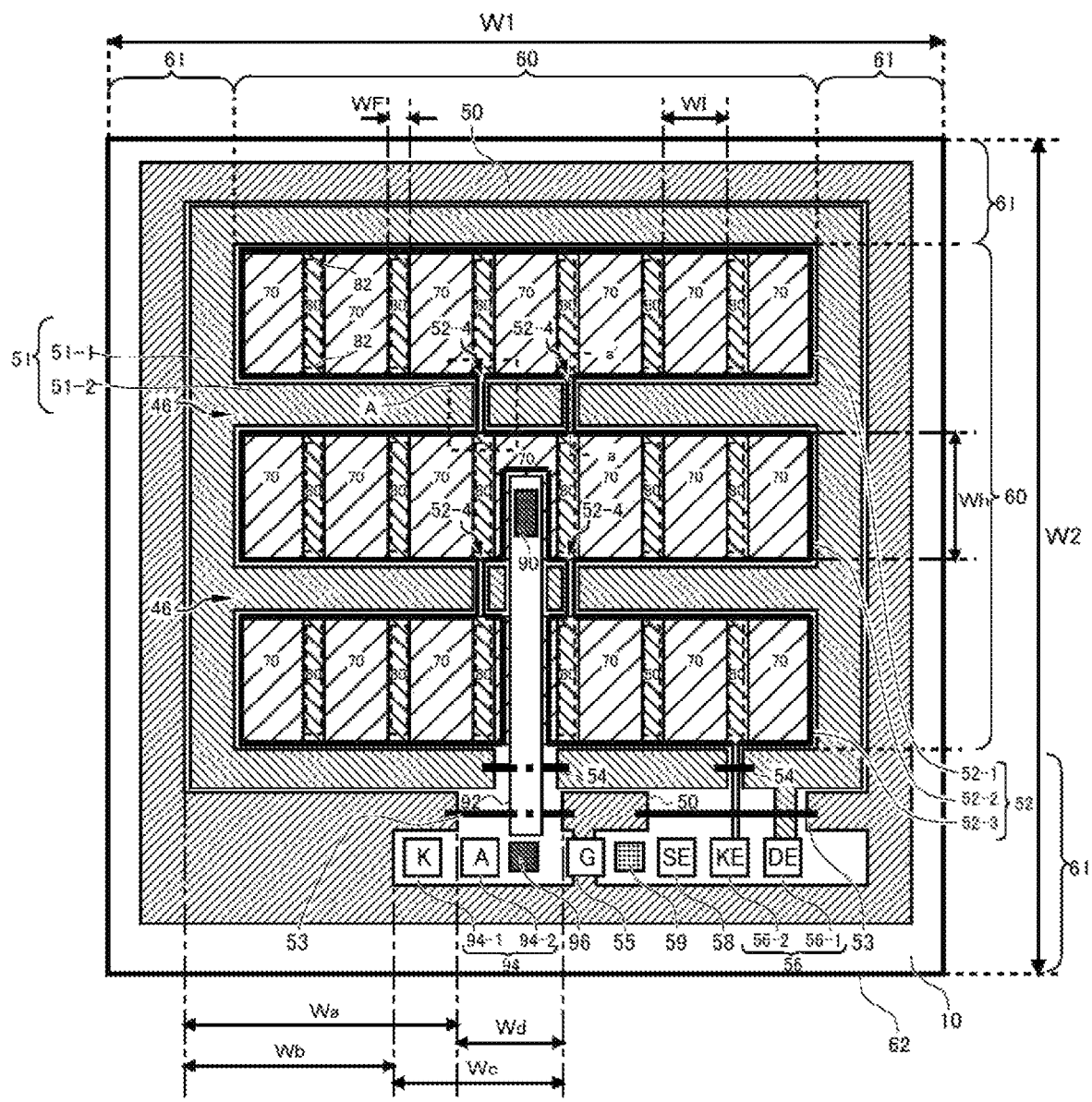
FIG. 4b shows another view of FIG. 4a in which the emitter electrode 52 is added.
Figure 4C:
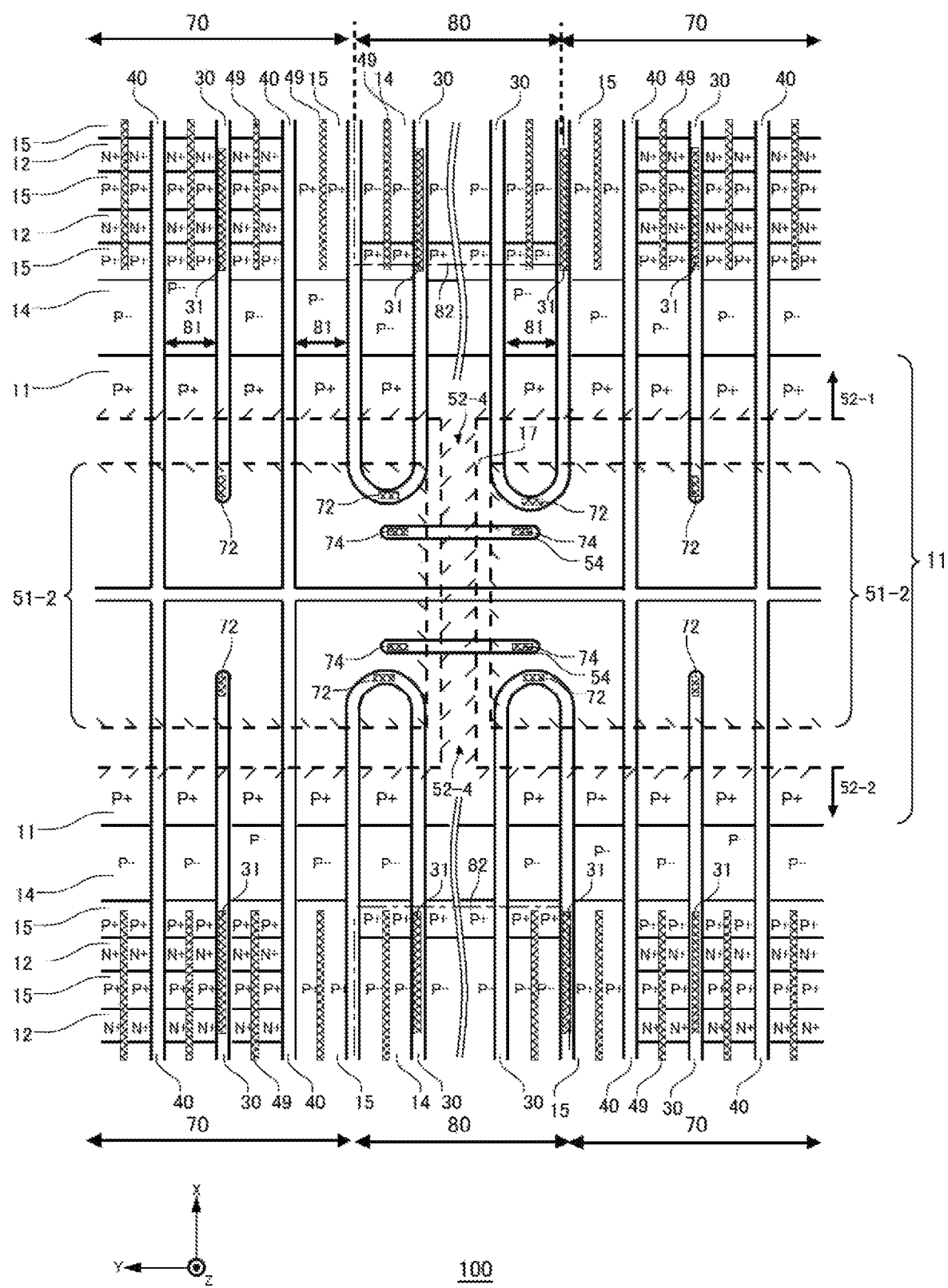
FIG. 4c shows a region A from FIG. 4b at an enlarged scale.
Figure 4D:
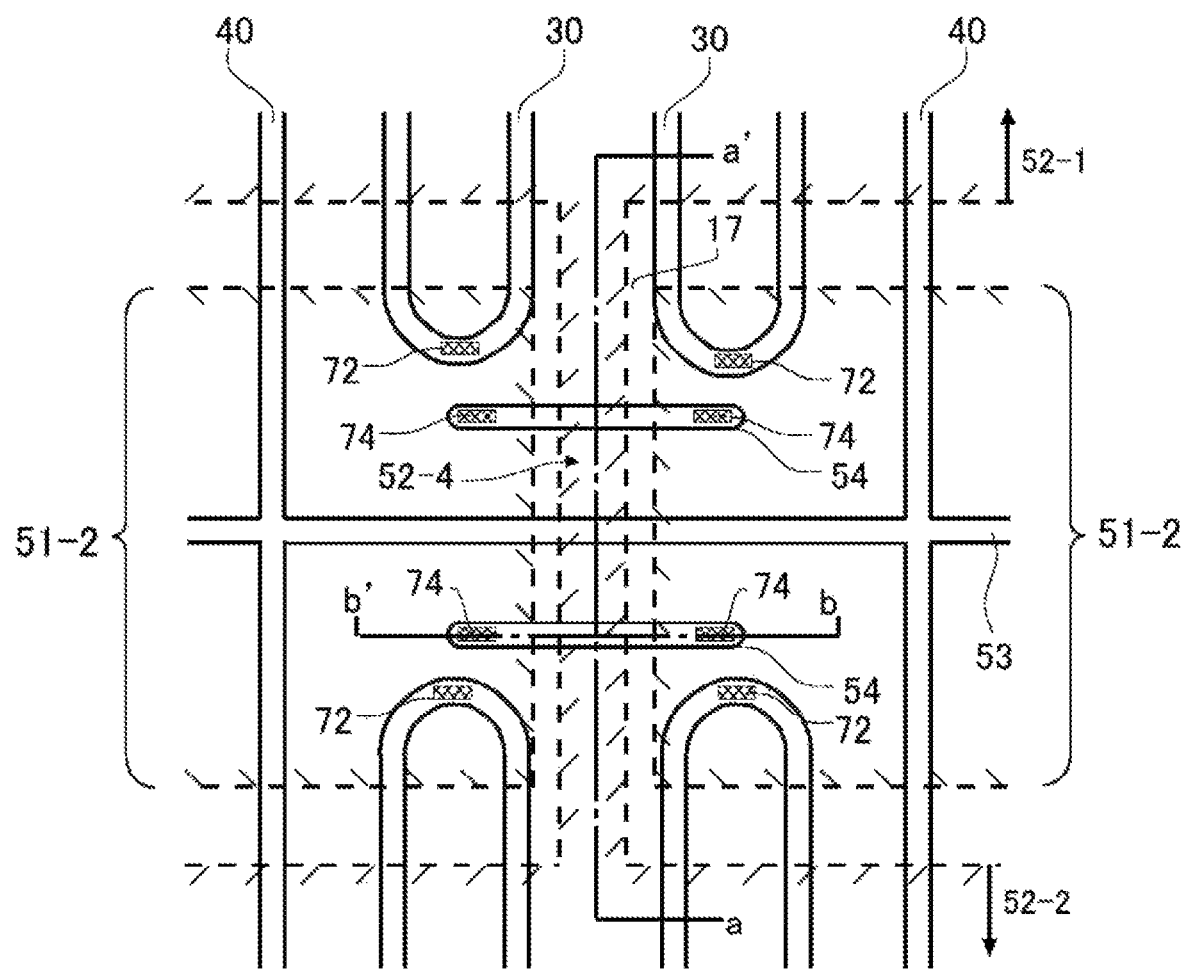
FIG. 4d shows a region near a first gap 17 at a further enlarged scale.
Figure 4E:
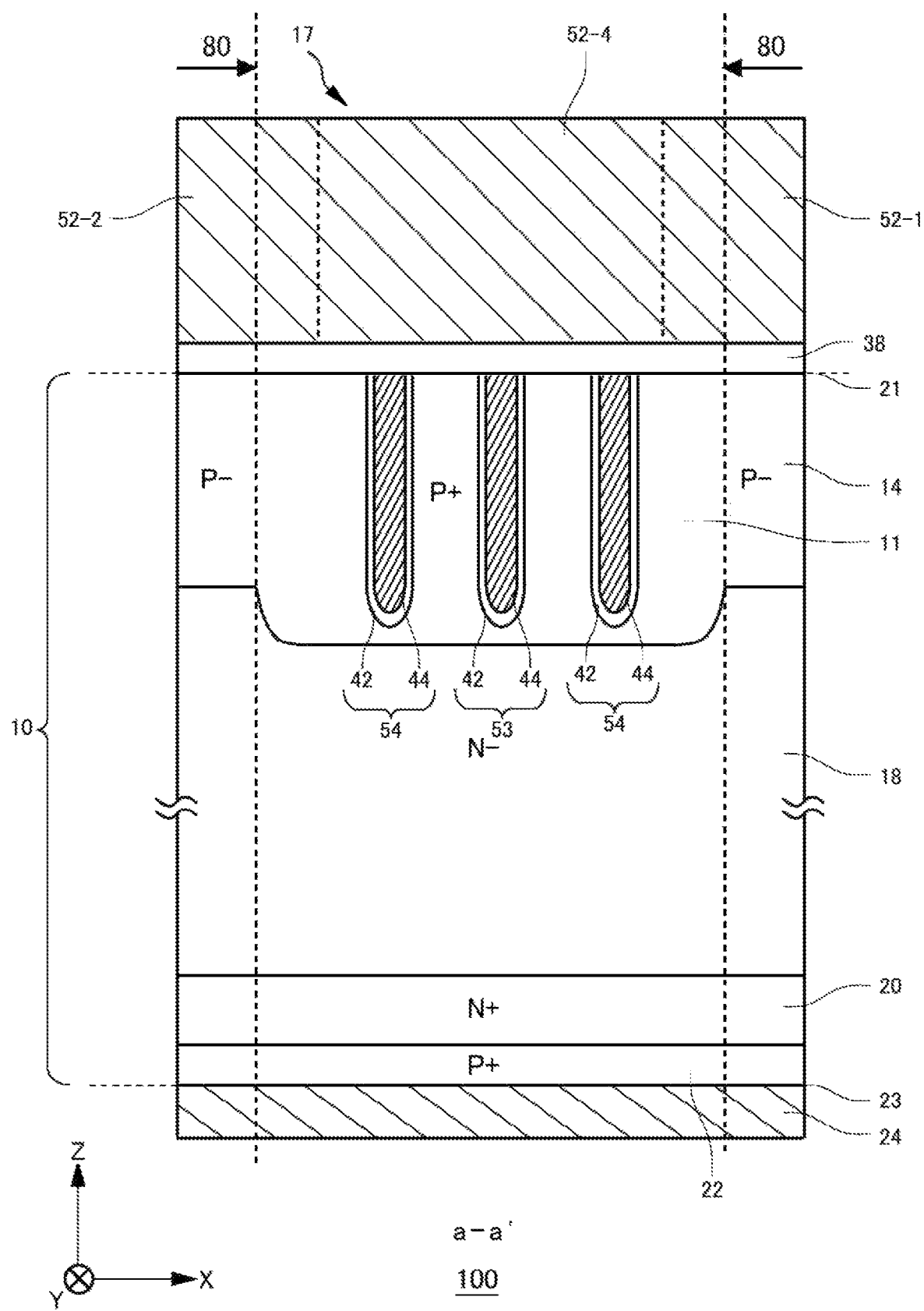
FIG. 4e shows an example of cross section a-a' from FIG. 4d.

Each transistor section 70 may include, in the order from the lower-surface side of the semiconductor substrate 10, a P type collector region 22, an N− type drift region 18 (refer to FIG. 4e. for example), a P− type base region 14 (refer to FIG. 4e, for example). An N+ type emitter region 12 and a P+ type contact region 15 (refer to FIG. 4c, for example) may each be selectively provided on the upper-surface side of the base region 14. The contact region 15 is connected to the emitter electrode. The gate trench portion 40 and the dummy trench portion 30 are provided from the upper surface of the semiconductor substrate 10 to the drift region 18 through the base region 14. The emitter region 12 is arranged in contact with the gate trench portion 40. The gate trench portion 40 and the dummy trench portion 30 may include a linear portion extending in a predetermined extending direction on the upper surface of the semiconductor substrate 10. While the extending direction is the X-axis direction in the example of FIG. 1e, the extending direction may be another direction such as the Y-axis direction.

As described above, each diode section 80 is a region in which the N+ type cathode region 82 is provided on the lower surface of the semiconductor substrate 10, and in which a P type region is provided entirely or regularly on the upper surface of the semiconductor substrate 10. The cathode region 82 is connected to the collector electrode 24. Each diode section 80 may include one or more dummy trench portions 30 provided regularly. Each diode section 80 may include, in the order from the lower-surface side of the semiconductor substrate 10, an N+ type cathode region 82, an N type drift region 18 and a P type anode region (base region 14). A P+ type contact region 15 may be selectively provided on the upper-surface side of the base region 14.

Figure 2:
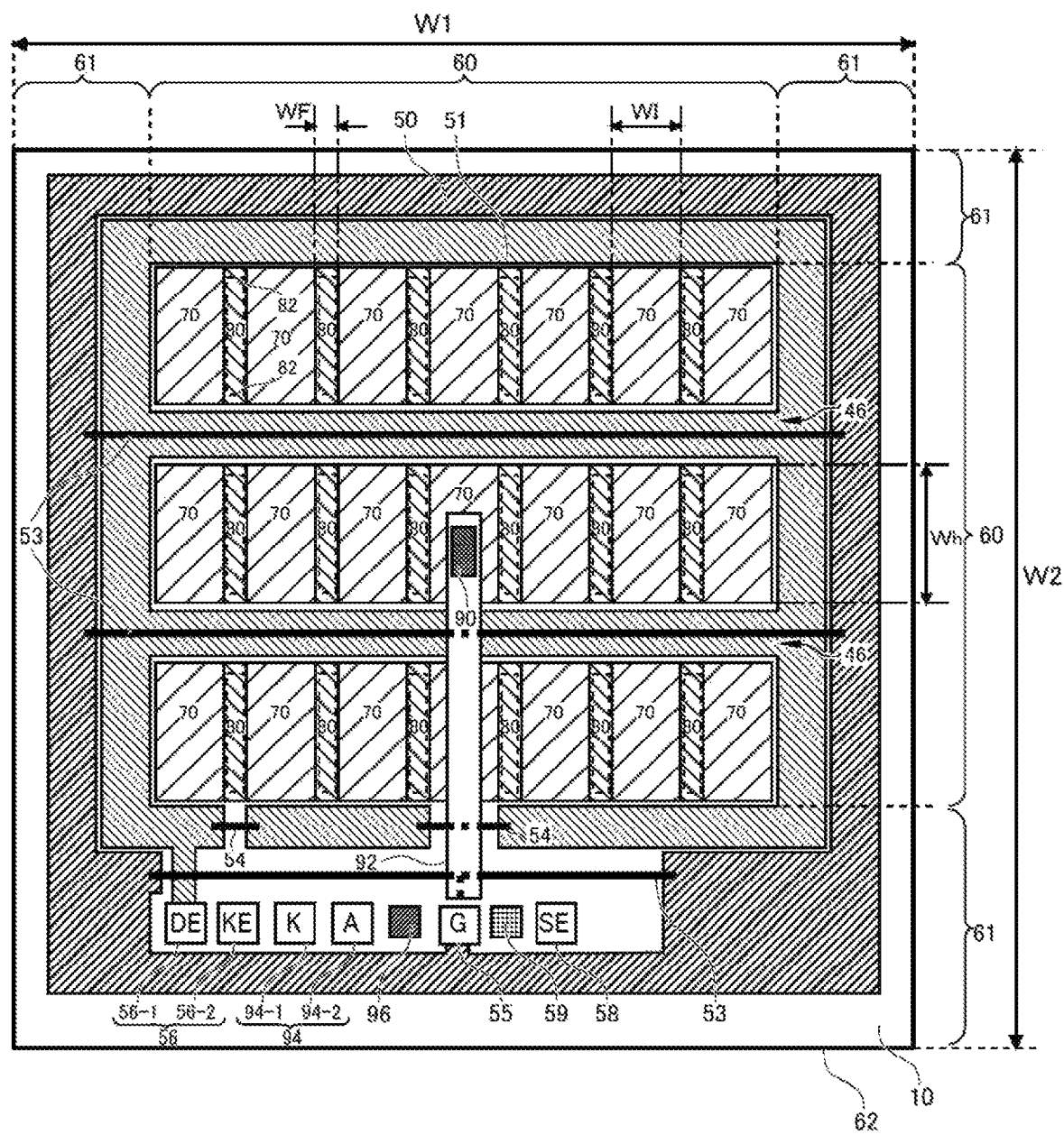
FIG. 2 shows a semiconductor device 150 according to a comparative example.

FIG. 2 shows a semiconductor device 150 according to a comparative example. In the semiconductor device 150 according to the comparative example, the gate pad 55 is arranged on the extension of the temperature-sensing wire 92 along the extending direction. Thus, the gate metal layer 50, which has a lower resistance than the gate runner 53, cannot be arranged at a more positive position in the X-axis direction than the gate pad 55. The gate runner 53, which has a higher resistivity than the gate metal layer 50, is provided between the gate pad 55 and the active section 60. Thus, the gate voltages supplied to the transistor sections 70, which is connected to the gate runner 53, may be decreased.

Figure 3:
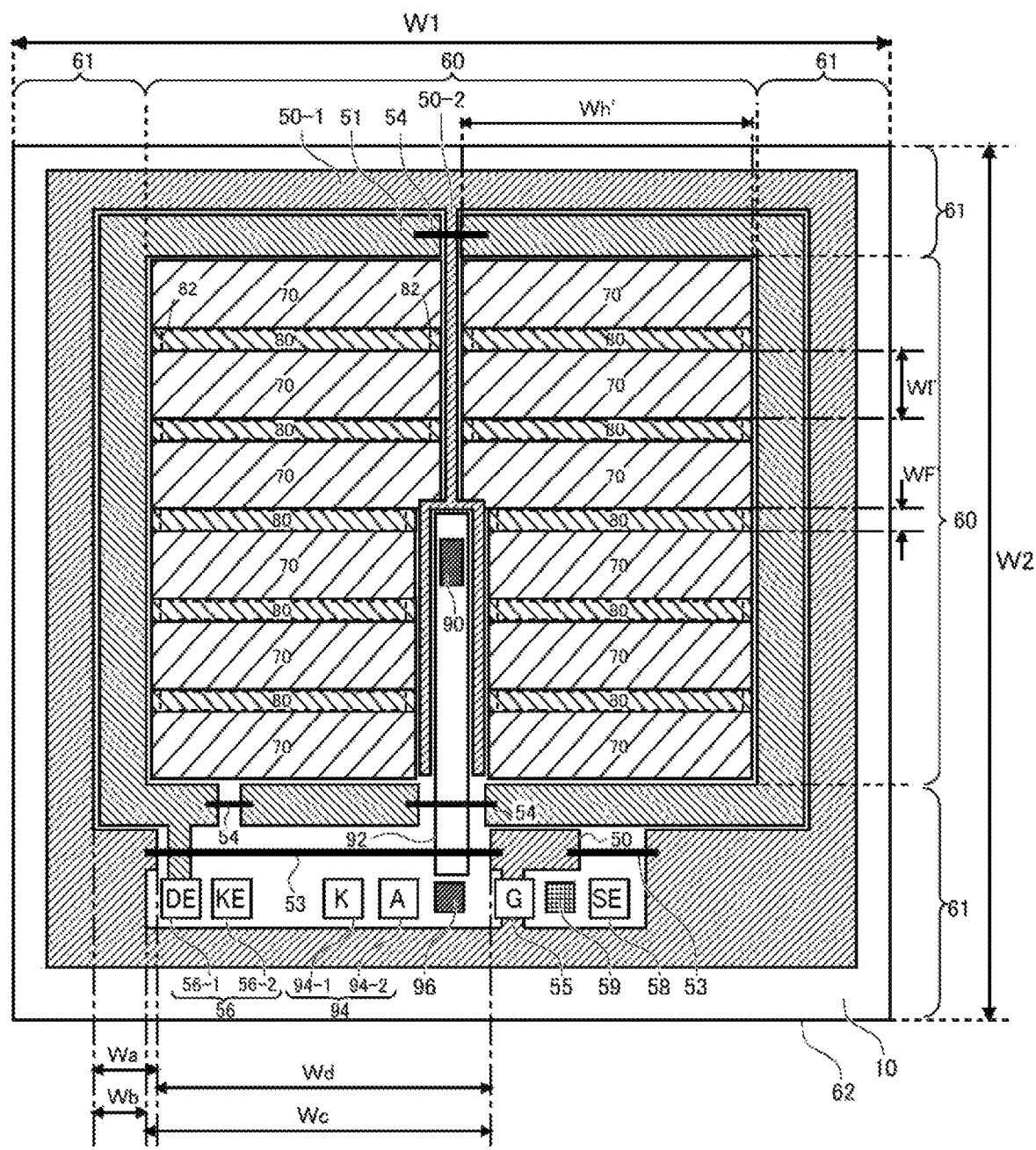
FIG. 3 shows another example of the upper surface of the semiconductor device 100 according to the present embodiment.

FIG. 3 shows another example of the upper surface of the semiconductor device 100 according to the present embodiment. In the semiconductor device 100 of the present example, the long sides of the transistor sections 70 and the diode sections 80 are provided along the Y-axis direction. As compared to the semiconductor device 100 shown in FIG. 1a, the orientation of the transistor sections 70 and the diode sections 80 differs by 90 degrees. That is, the extending direction of the temperature-sensing wire 92 (the X-axis direction) and the array direction of the transistor sections 70 and the diode sections 80 (the X-axis direction) are parallel to each other.

The temperature-sensing unit 90 may be provided adjacent to transistor sections 70 in the Y-axis direction. In a direction perpendicular to the extending direction of the temperature-sensing wire 92 (the Y-axis direction in the present example), only transistor sections 70 or diode sections 80 may be arranged between the temperature-sensing unit 90 or the temperature-sensing wire 92 and the dummy gate metal layer 51 or the gate metal layer 50. The transistor sections 70 occupy more than half the area of the active section 60, and the temperature of the active section 60 is more dependent on the temperature near the transistor sections 70 than near the diode sections 80. Thus, according to the semiconductor device 100 of the present example, the temperature of the active section 60 can be measured more accurately.

Width Wh', the Y-axis direction width of each of the transistor sections 70 and the diode sections 80, may be different from width Wh, the X-axis direction width of each of the transistor sections 70 and the diode sections 80 in the semiconductor device 100 shown in FIG. 1a. Width WI', the X-axis direction of each transistor section 70, may be different from width WI, the Y-axis direction width of each transistor section 70 in the semiconductor device 100 shown in FIG. 1a. Width WF', the X-axis direction width of each diode section 80, may be different from width Wf, the Y-axis direction width of each diode section in the semiconductor device 100 shown in FIG. 1a.

In the present example, the gate metal layer 50 includes an outer gate metal layer 50-1 provided in the peripheral region 61 and an inner gate metal layer 50-2 provided above the active section 60. The outer gate metal layer 50-1 surrounds the active section 60 in top view. The inner gate metal layer 50-2 is connected to the outer gate metal layer 50-1. In the present example, the inner gate metal layer 50-2 is provided to divide the active section 60 at the Y-axis direction center of the semiconductor substrate. The temperature-sensing wire 92 may be disposed between portions of the inner gate metal layer 50-2 in top view. For example, a portion of the inner gate metal layer 50-2 may be provided from the side of the outer gate metal layer 50-1 opposite the temperature-sensing wire 92 in the X-axis direction toward the temperature-sensing wire 92. The portion of the inner gate metal layer 50-2 extends to a position near the end of the temperature-sensing wire 92 (or the temperature-sensing unit 90) in the X-axis direction. The inner gate metal layer 50-2 branches into two portions near the end of the temperature-sensing wire 92 (or the temperature-sensing unit 90). The temperature-sensing wire 92 is disposed between the two portions of the inner gate metal layer 50-2 in the Y-axis direction. In this case, the inner gate metal layer 50-2 serves as the dividing portion 46. The dummy gate metal layer 51 may be divided by the inner gate metal layer 50-2. A dummy gate runner 54 may be provided over the inner gate metal layer 50-2 and connect the divided portions of the dummy gate metal layer 51.

The gate trench portions and the dummy trench portions may be arrayed in the X-axis direction. In this case, the trench portions extend in the Y-axis direction. Alternatively, the gate trench portions and the dummy trench portions may be arrayed in the Y-axis direction. In this case, the trench portions extend in the X-axis direction. In the present example, the trench portions extend in the Y-axis direction.

In the present example, the extending direction of the gate metal layer 50 at the central portion of the semiconductor device (the X-axis direction), the extending direction of the temperature-sensing wire 92 (the X-axis direction) and the array direction of the transistor sections 70 and the diode sections 80 (the X-axis direction) are parallel to each other.

FIG. 4a shows another example of the upper surface of the semiconductor device 100 according to the present embodiment. The semiconductor device 100 of the present example is different from the semiconductor device 100 shown in FIG. 1a in that the dummy gate pad 56-1 and the Kelvin pad 56-2 are provided on the same side as the gate pad 55 with respect to the temperature-sensing wire 92 and its extension. That is, in the semiconductor device 100 of the present example, all the voltage-supplying pads 56 are provided in the same divided region as the gate pad 55 (the second divided region 68).

In the semiconductor device 100 of the present example, width Wa may be 1.1 times or more and 1.5 times or less width Wb. Width Wd may be 0.5 times or more and 1.0 times or less width Wa. Width Wc may be 0.8 times or more and 1.2 times or less width Wb. In the present example, width Wb>width Wd. That is, the Y-axis direction length of the gate runner 53, provided to cross a region below the temperature-sensing wire 92 in the Y-axis direction, is smaller than that in the semiconductor device 100 shown in FIG. 1a.

In the semiconductor device 100 of the present example, width Wa is 4040 μm, as an example. As an example, width Wb is 3400 μm. As an example, width Wc is 3500 μm. As an example, width Wd is 2860 μm.

In the semiconductor device 100 of the present example, the gate pad 55 is arranged out of the extension of the temperature-sensing wire 92. In the semiconductor device 100 of the present example, the dummy gate pad 56-1 and the Kelvin pad 56-2 are provided on the same side as the gate pad 55 with respect to the temperature-sensing wire 92 and its extension. Thus, the Y-axis direction length of the gate runner 53, provided to cross a region below the temperature-sensing wire 92 in the Y-axis direction, can be reduced as compared to the semiconductor device 100 shown in FIG. 1a.

In the semiconductor device 100 of the present example, the length of the gate runner 53, which has a higher resistance than the gate metal layer 50, can be reduced as compared to the example shown in FIG. 1a, so that the gate voltages supplied to the transistor sections 70 can be more uniformed than in the semiconductor device 100 shown in FIG. 1a. This can prevent decrease in the withstand capability of the transistor sections 70.

In addition, the semiconductor device 100 of the present example is different from the semiconductor device 100 shown in FIGS. 1a to 1e in that a first gap 17 is provided in the dividing portion 46 for connecting a plurality of regions (52-1, 52-2 and 52-3, refer to FIG. 1d) of the emitter electrode 52 to the dummy gate metal layer 51. In another example, the arrangement of the pads may be the same as that in FIGS. 1a to 1e, and the difference from the semiconductor device 100 shown in FIGS. 1a to 1e may be that the first gap 17 is provided.

In the present example, a portion of the dummy gate metal layer 51 arranged in the peripheral region 61 is referred to as an outer dummy gate metal layer 51-1, and a portion of the dummy gate metal layer 51 arranged above the active section 60 is referred to as an inner dummy gate metal layer 51-2. The outer dummy gate metal layer 51-1 is connected to the dummy gate pad 56-1. The inner dummy gate metal layer 51-2 connects the outer dummy gate metal layer 51-1 and the conductive portions 44 of the dummy trench portions 30.

The first gap 17 described above is provided in the inner dummy gate metal layer 51-2. A dummy gate runner 54 is provided in the first gap 17. Both ends of the dummy gate runner 54 are each connected to the inner dummy gate metal layer 51-2. One end of the dummy gate runner 54 may be connected to the outer dummy gate metal layer 51-1.

FIG. 4b shows another view of FIG. 4a in which the emitter electrode 52 is added. In FIG. 4b, the region in which the emitter electrode 52 is formed in FIG. 4a is enclosed with thick lines. For ease of understanding, FIG. 4b omits the gate runner 53 and the dummy gate runner 54 shown in FIG. 4a. The emitter electrode 52 includes a connecting region 52-4 connecting a plurality of divided regions. The connecting region 52-4 is provided in the first gap 17 as shown in FIG. 4a.

FIG. 4c shows a region A from FIG. 4b at an enlarged scale. FIG. 4c is a top view of the semiconductor substrate 10. In FIG. 4c, the outer shapes of the emitter electrode 52 and the inner dummy gate metal layer 51-2 are indicated by bold dashed lines. An interlayer dielectric film is provided above the semiconductor substrate 10, but is omitted in FIG. 4c. For example, an interlayer dielectric film is provided between the upper surface of the semiconductor substrate 10 and each of the inner dummy gate metal layer 51-2 the emitter electrode 52, but is omitted in FIG. 4c. Also, an interlayer dielectric film provided between the semiconductor substrate 10 and each of the gate runner 53 and the dummy gate runner 54, and an interlayer dielectric film provided between each of the gate runner 53 and the dummy gate runner 54 and each of the emitter electrode 52 and the inner dummy gate metal layer 51-2 are omitted in FIG. 4c.

As described above, the inner dummy gate metal layer 51-2 extends in the Y-axis direction. The inner dummy gate metal layer 51-2 has the first gap 17. Two portions of the inner dummy gate metal layer 51-2 between which the first gap 17 is disposed are electrically connected by the dummy gate runner 54, which is formed of a conductive material such as polysilicon. The inner dummy gate metal layer 51-2 and the dummy gate runner 54 are electrically connected by a contact hole 74 formed in the interlayer dielectric film. A plurality of dummy gate runners 54, for each first gap 17, may be provided in parallel.

The emitter electrode 52 is divided into a plurality of regions by the inner dummy gate metal layer 51-2 and the dummy gate runner 54. In the example of FIG. 4c, a first region 52-1 and a second region 52-2 are shown. The emitter electrode 52 includes a connecting region 52-4 traversing a region above the dummy gate runner 54 in the X-axis direction and connecting the first region 52-1 and the second region 52-2. The first region 52-1, the second region 52-2 and the connecting region 52-4 may be integrally formed of the same material.

The dummy gate runner 54 may be a trench-type runner formed in the semiconductor substrate 10. In this case, the dummy gate runner 54 may include an insulating film 42 formed on the inner wall of the trench and a conductive portion 44 covered by the insulating film 42, similar to the gate trench portion 40. FIG. 4c represents a case in which the dummy gate runner 54 is a trench-type runner. In another example, the dummy gate runner 54 may be a wire that is formed of polysilicon or the like and is provided between the semiconductor substrate 10 and each of the inner dummy gate metal layer 51-2 and the connecting region 52-4 via the interlayer dielectric film.

The above-described structure allows the regions of the emitter electrode 52 to be connected by the metallic connecting region 52-4. This achieves a uniform potential of the emitter electrode 52 and improves thermal conduction between its regions. Also, providing the connecting region 52-4 of the emitter electrode 52 and the dummy gate runner 54 to cross in a bridged manner allows the portions of the inner dummy gate metal layer 51-2 separated by the connecting region 52-4 to be electrically connected to each other.

Similar to the dummy gate runner 54, the gate runner 53 also crosses the connecting region 52-4 in a bridged manner in the first gap 17. The gate runner 53 may be formed at the same height (Z-axis direction position) as the dummy gate runner 54. This allows the gate runner 53 to extend in the Y-axis direction while connecting the regions of the emitter electrode 52 by the connecting region 52-4. The gate runner 53 may be a trench-type runner formed in the semiconductor substrate 10. FIG. 4c represents a case in which the gate runner 53 is a trench-type runner.

In the present example, the boundary between a transistor section 70 and a diode section 80 is a U-shaped dummy trench portion 30 adjacent to a linear-shaped gate trench portion 40 in the Y-axis direction. Regarding two diode sections 80 opposed via the inner dummy gate metal layer 51-2 in the X-axis direction, the region between the X-axis direction ends of the U-shaped dummy trench portion 30 may be regarded as a diode section 80 for convenience. In FIG. 4c, the dummy trench portion 30 having a U-shaped end may have the opposite end that is U-shaped. That is, the dummy trench portion 30 may have an oval-like shape having both X-axis direction ends with a U-shape.

In the present example, each transistor section 70 includes one or more gate trench portions 40 and one or more dummy trench portions 30. The gate trench portions 40 and the dummy trench portions 30 in the transistor sections 70 may extend in the X-axis direction and be provided alternately in the Y-axis direction. Each gate trench portions 40 in the transistor sections 70 may extend from one of two transistor sections 70 opposed in the X-axis direction to the other transistor section 70. Each dummy trench portion 30 may terminate in the well region 11 with a linear shape. Each gate trench portion 40 in the transistor sections 70 may traverse the inner dummy gate metal layer 51-2 in the X-axis direction below the inner dummy gate metal layer 51-2.

Each dummy trench portion 30 in the diode section 80 may not be provided in at least a part of the region between two diode sections 80 opposed in the X-axis direction. That is, the dummy trench portion 30 may be spaced apart from the two diode sections 80 opposed in the X-axis direction. Note that the X-axis direction end of each dummy trench portion 30 extends to a position below the inner dummy gate metal layer 51-2. The conductive portion 44 of each dummy trench portion 30 is electrically connected to the inner dummy gate metal layer 51-2 via the contact hole 72 provided in the interlayer dielectric film.

In the present example, each dummy trench portion 30 in the diode sections 80 has both X-axis direction ends with a U-shape. The U-shape may be constituted by two longitudinal portions parallel to the X-axis direction and one lateral portion parallel to the Y-axis direction. Each dummy trench portion 30 in diode sections 80 located on the positive side in the X-axis direction relative to the inner dummy gate metal layer 51-2 may have an end with a U-shape in the normal orientation, and each dummy trench portion 30 in diode sections 80 located on the more negative side in the X-axis direction relative to the inner dummy gate metal layer 51-2 may have an end with a U-shape in the reverse orientation. Each dummy trench portion 30 in the diode sections 80 may have a shape formed by connecting the normal U-shape and the reverse U-shape at their longitudinal portions.

Each of the gate trench portions 40 and the dummy trench portions 30 may be provided in the semiconductor substrate 10. The conductive portion 44 of each gate trench portion 40 may perpendicularly cross the trench-type gate runner 53 extending along the Y-axis direction to be electrically connected to the gate runner 53. In the present example, the gate runner 53 is provided along the inner dummy gate metal layer 51-2 below the inner dummy gate metal layer 51-2. As described above, the gate runner 53 traverses a region below the connecting region 52-4 of the emitter electrode 52 in the Y-axis direction. The X-axis direction width of the gate runner 53 may be smaller than the X-axis direction width of the inner dummy gate metal layer 51-2.

The conductive portion 44 of each dummy trench portion 30 may be electrically connected to the emitter electrode 52 through a contact hole 31 provided in the interlayer dielectric film. Note that, while each dummy trench portion 30 in the diode sections 80 is connected to the inner dummy gate metal layer 51-2 via the contact hole 72 in the example of FIG. 4c, each dummy trench portion 30 in the transistor sections 70 may also be connected to the inner dummy gate metal layer 51-2 via the contact hole 72 in another example. The inner dummy gate metal layer 51-2 may be provided above the well region 11.

Each of the transistor sections 70 and the diode sections 80 has a structure similar to that of each of the transistor sections 70 and the diode sections 80 as shown in FIG. 1c, except for the shape of the trench portions. The Y-axis direction width of the connecting region 52-4 may be smaller than the Y-axis direction width of each diode section 80. The width of the connecting region 52-4 may be ¾ or less of the width of the diode section 80, or may be ½ or less of the width of the diode section 80. For example, the width of the diode section 80 is 200 μm, and the width of the connecting region 52-4 is 80 μm. Designing the width of the connecting region 52-4 to be smaller than the width of the diode section 80 allows the Y-axis direction length of the inner dummy gate metal layer 51-2 to be increased by a corresponding amount. Accordingly, the distance between contact holes 74 of the dummy gate runner 54 can be reduced. This reduces the resistance of the dummy gate runner 54 between the contact holes 74.

FIG. 4d shows a region near the first gap 17 at a further enlarged scale. In FIG. 4d, cross section a-a' is a cross section that traverses the connecting region 52-4 of the emitter electrode 52 in the X-axis direction. Cross section b-b' is a cross section that traverses the dummy gate runner 54 in the Y-axis direction.

FIG. 4e shows an example of cross section a-a' from FIG. 4d. In the present example, the gate runner 53 and the dummy gate runner 54 are trench-type runners. Each of the gate runner 53 and the dummy gate runner 54 includes a trench formed from the upper surface 21 of the semiconductor substrate 10 to the inside of the semiconductor substrate 10, an insulating film 42 formed on the inner wall of the trench, and a conductive portion 44 covered by the insulating film 42. Each of the gate runner 53 and the dummy gate runner 54 is entirely formed inside the well region 11.

Each of the gate runner 53 and the dummy gate runner 54 extends in the Y-axis direction. An interlayer dielectric film 38 is provided on the upper surface 21 of the semiconductor substrate 10, and the connecting region 52-4 extends above the interlayer dielectric film 38 in the X-axis direction.

The above-described structure allows the gate runner 53 and the dummy gate runner 54 to cross the connecting region 52-4 of the emitter electrode 52 in a bridged manner. Moreover, designing the gate runner 53 and the dummy gate runner 54 as trench-type runners allows the structures on the upper surface 21 of the semiconductor substrate 10 to be more flattened.

The semiconductor substrate 10 may be a silicon substrate, a silicon carbide substrate, a nitride semiconductor substrate such as gallium nitride, or the like. In the present example, the semiconductor substrate 10 is a silicon substrate.

Above the interlayer dielectric film 38, the first region 52-1 of the emitter electrode 52 is provided at a more positive position in the X-axis direction, and the second region 52-2 of the emitter electrode 52 is provided at a more negative position in the X-axis direction. The connecting region 52-4 is provided in the region disposed between the first region 52-1 and the second region 52-2.

The semiconductor device 100 of the present example includes, in the diode sections 80, a base region 14 provided on the upper surface 21. As an example, the base region 14 is of P− type. In the region disposed between two diode sections 80 at more positive and negative positions in the X-axis direction, the well region 11 is formed deeper in the upper surface 21 than the base region 14. As an example, the well region 11 is of P+ type.

In the semiconductor device 100 of the present example, the collector region 22 is provided on the lower surface 23. As an example, the collector region 22 is of P+ type. The collector region 22 may be longer in the X-axis direction than the width of the well region 11. The collector region 22 may overlap a region of the diode section 80.

A drift region 18 is provided below the base region 14 and the well region 11. As an example, the drift region 18 is of N− type. A buffer region 20 is provided below the drift region 18. As an example, the buffer region 20 is of N+ type. A collector electrode 24 is provided on the lower surface 23.

In the semiconductor device 100 of the present example, the connecting region 52-4 connecting the emitter electrode 52-1 and the emitter electrode 52-2 is provided in the first gap 17. The connecting region 52-4 connecting the emitter electrode 52-2 and the emitter electrode 52-3 is also provided in the first gap 17. This can achieve a more uniform emitter potential than in the semiconductor device 100 shown in FIG. 1a.

Figure 4F:
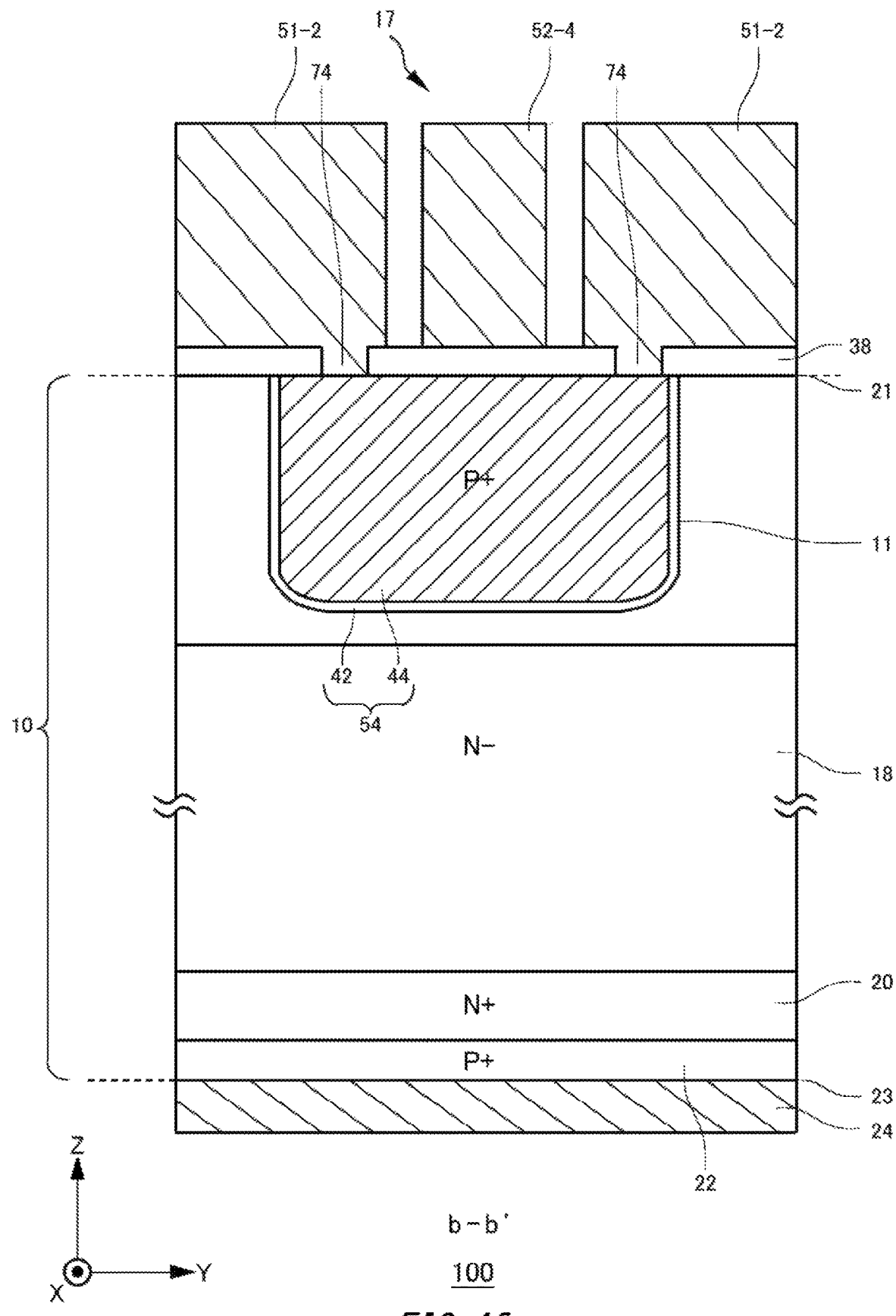
FIG. 4f shows an example of cross section b-b' from FIG. 4d.

FIG. 4f shows an example of cross section b-b' from FIG. 4d. The dummy gate runner 54 may be a trench-type runner formed in the semiconductor substrate 10. The interlayer dielectric film 38 is formed between the dummy gate runner 54 and the connecting region 52-4 of the emitter electrode 52.

The dummy gate runner 54 is electrically connected, via the contact hole 74, to the two portions of the inner dummy gate metal layer 51-2 arranged on both sides of the first gap 17 in the Y-axis direction. The dummy gate runner 54 traverses a region below the connecting region 52-4 in the Y-axis direction, and the connecting region 52-4 traverses a region above the dummy gate runner 54 in the X-axis direction. This structure allows two regions of the emitter electrode 52 to be connected by a metal component while securing the electrical connection of the inner dummy gate metal layer 51-2.

Figure 5A:
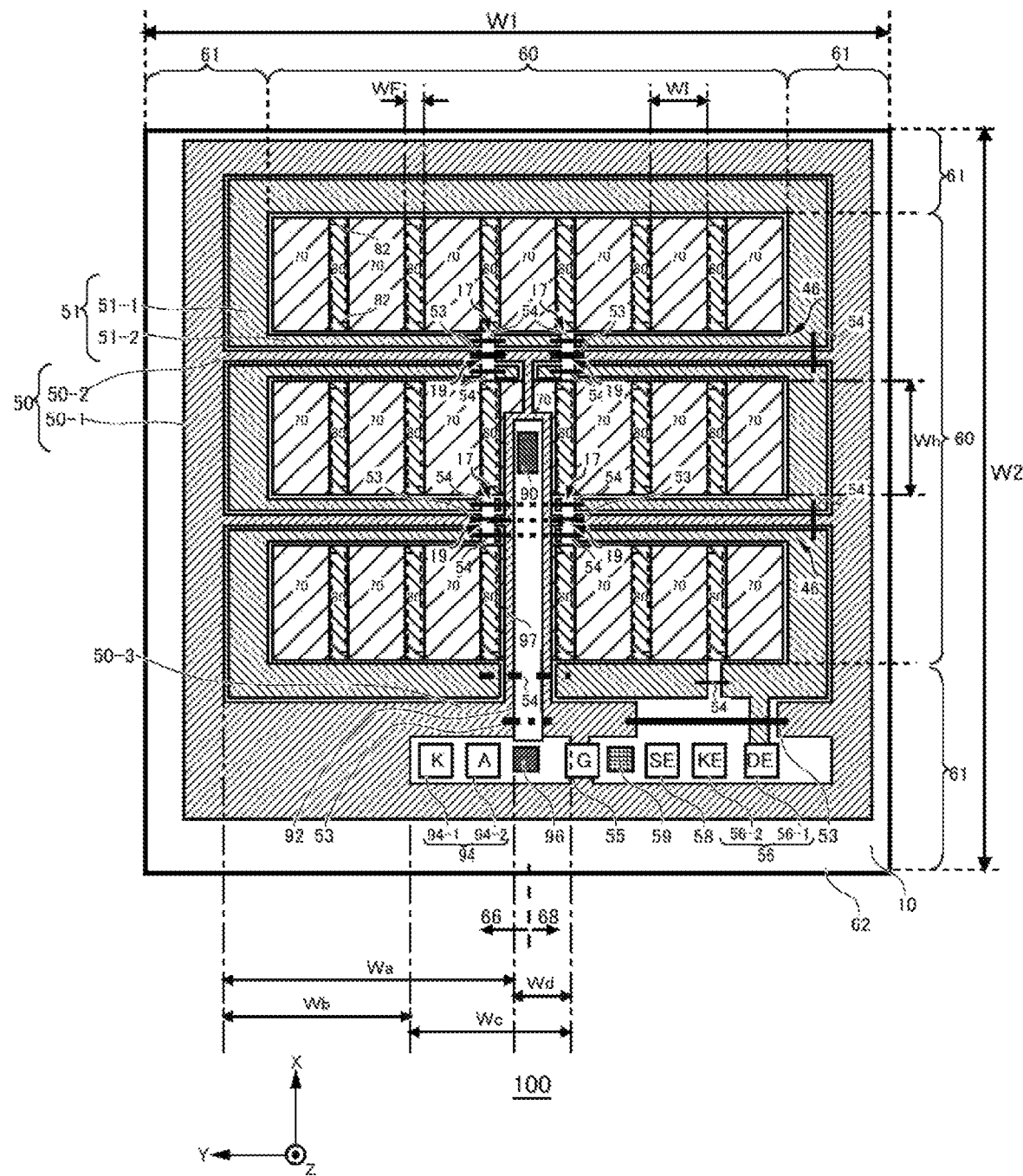
FIG. 5a shows another example of the upper surface of the semiconductor device 100 according to the present embodiment.

FIG. 5a shows another example of the upper surface of the semiconductor device 100 according to the present embodiment. The semiconductor device 100 of the present example is different from the semiconductor device 100 shown in FIG. 4a in that a gate metal layer 97 is provided along the temperature-sensing wire 92. The gate metal layer 97 may be integrally formed of the same material as the gate metal layer 50. Also, in the present example, the gate metal layer 50 includes an outer gate metal layer 50-1 and an inner gate metal layer 50-2.

The outer gate metal layer 50-1 is a portion of the gate metal layer 50 arranged in the peripheral region 61. The outer gate metal layer 50-1 may be provided to surround the active section 60 in top view of the semiconductor substrate 10. The inner gate metal layer 50-2 is arranged above the active section 60. The outer gate metal layer 50-1 is connected to the gate pad 55. The inner gate metal layer 50-2 connects the outer gate metal layer 50-1 and the conductive portion 44 of each gate trench portion 40. In the present example, the inner gate metal layer 50-2 extends in the Y-axis direction. In the present example, the outer dummy gate metal layer 51-1, which extends in the X-axis direction, is divided by the inner gate metal layer 50-2 in the X-axis direction. The inner dummy gate metal layer 51-2 is also divided by the inner gate metal layer 50-2 in the X-axis direction. That is, the inner gate metal layer 50-2 is disposed between two portions of the inner dummy gate metal layer 51-2 in the X-axis direction.

A second gap 19 is provided in the inner gate metal layer 50-2. That is, the inner gate metal layer 50-2 is separated at the second gap 19. The second gap 19 is provided at a position opposed to the first gap 17 in the X-axis direction. That is, the second gap 19 may be arranged at substantially the same position in the Y-axis direction as the first gap 17. The gate runner 53 is provided in the second gap 19. The gate runner 53 may be adjacent to the dummy gate runner 54 and arranged at substantially the same position in the Y-axis direction as the dummy gate runner 54.

Both ends of the gate runner 53 are each connected to the inner gate metal layer 50-2. One end of the gate runner 53 may be connected to the outer gate metal layer 50-1.

The connecting region 52-4 connecting the regions of the emitter electrode 52 is provided in the first gap 17 and the second gap 19. As the connecting region 52-4 of the emitter electrode 52 crosses the gate runner 53 and the dummy gate runner 54 in a bridged manner in the first gap 17 and the second gap 19, the regions of the emitter electrode 52 can be connected by the metallic connecting region 52-4 while securing the electrical connection of the inner gate metal layer 50-1 and the electrical connection of the inner dummy gate metal layer 51-1.

Note that the gate runner 53 and the dummy gate runner 54, which cross the temperature-sensing wire 92 in top view of the semiconductor substrate 10, are provided continuously, passing through a region below the temperature-sensing wire 92 in the Y-axis direction.

The gate metal layer 97, which is provided along the temperature-sensing wire 92, may be provided to surround the positive and negative Y-axis direction sides and the positive X-axis direction side of the temperature-sensing wire 92. The gate metal layer 97 may extend in a direction substantially parallel to the longitudinal direction of the temperature-sensing wire 92, and be connected to the inner gate metal layer 50-2, which extends in the Y-axis direction from the outside to inside of the active section 60 in top view of the semiconductor substrate 10.

In top view of the semiconductor substrate 10, any other metal electrode is not provided between the gate metal layer 97 and the temperature-sensing wire 92. However, the gate metal layer 97 and the temperature-sensing wire 92 are separated from each other. Two portions of the gate metal layer 97 between which the temperature-sensing wire 92 is disposed in the Y-axis direction may extend substantially parallel to the longitudinal direction of the temperature-sensing wire 92. The two portions of the gate metal layer 97 are connected to each other at the X-axis direction end of the temperature-sensing wire 92 (or the temperature-sensing unit 90). The connecting portion of the gate metal layer 97 may extend in a direction substantially orthogonal to the longitudinal direction of the temperature-sensing wire 92. The connecting portion of the gate metal layer 97 may be connected to the portion of the inner gate metal layer 50-2 disposed between two portions of the inner dummy gate metal layer 51-2.

In the semiconductor device 100 of the present example, the inner gate metal layer 50-2, which has a lower resistance than the gate runner 53, extends to a position above the active section 60, and the gate metal layer 97 is provided along the temperature-sensing wire 92, and thus the gate voltages supplied to the transistor sections 70 can be more uniformed than in the semiconductor device 100 shown in FIG. 4a. This can prevent decrease in the withstand capability of the transistor sections 70.

In the semiconductor device 100 of the present example, width Wa may be 1.5 times or more and 2.5 times or less width Wb. Width Wd may be 0.01 times or more and 0.1 times or less width Wa. Width Wc may be 0.8 times or more and 1.2 times or less width Wb. In the present example, width Wb<width Wd. That is, the Y-axis direction length of the gate runner 53, provided to cross a region below the temperature-sensing wire 92 in the Y-axis direction, is smaller than that in the semiconductor device 100 shown in FIG. 1a. The ratio Wb/Wd in the present example is even larger than the ratio Wb/Wd in the semiconductor device 100 shown in FIG. 4a.

In the semiconductor device 100 of the present example, width Wa is 6650 μm, as an example. As an example, width Wb is 3400 μm. As an example, width Wc is 3500 μm. As an example, width Wd is 250 μm.

In the semiconductor device 100 of the present example, the gate pad 55 is arranged at a position outside the extending region 64, and the dummy gate pad 56-1 and the Kelvin pad 56-2 are provided in the same divided region (the second divided region 68 in the present example) as the gate pad 55. Thus, the Y-axis direction length of the gate runner 53, provided to cross a region below the temperature-sensing wire 92 in the Y-axis direction, can be reduced as compared to the semiconductor device 100 shown in FIG. 1a.

In the semiconductor device 100 of the present example, the length of the gate runner 53, which has a higher resistance than the gate metal layer 50, can be reduced as compared to the example shown in FIG. 1a. That is, in the first divided region 66, in which the gate pad 55 is not provided, a gate metal layer 50-3 provided between the active section 60 and the temperature-measurement pad 94 can extend in the Y-axis direction to a position near the temperature-sensing wire 92. This allows the gate voltage to be applied, via the gate metal layer 50-3, to the gate trench portions 40 of the transistor sections 70 opposed to the temperature-measurement pad 94. Therefore, as compared to the semiconductor device 100 shown in FIG. 1a, the gate voltages supplied to the transistor sections 70 can be uniformed. This can prevent decrease in the withstand capability of the transistor sections 70.

Figure 5B:
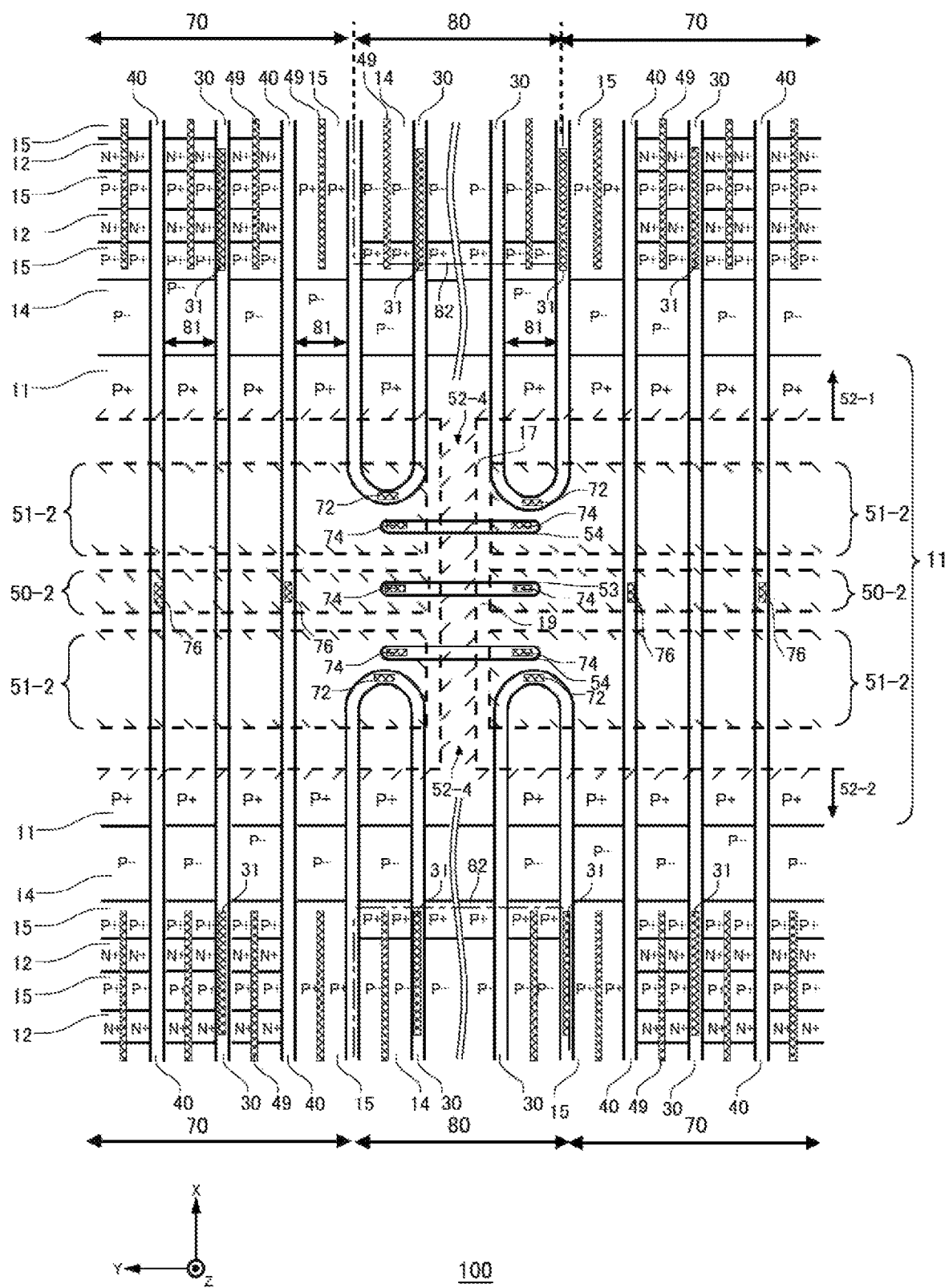
FIG. 5b shows a region of the upper surface of the semiconductor substrate 10 near the first gap 17 and a second gap 19.

FIG. 5b shows a region of the upper surface of the semiconductor substrate 10 near the first gap 17 and the second gap 19. The structures of the transistor sections 70 and the diode sections 80 in the present example are similar to those in the example shown in FIG. 4c.

In FIG. 5b, the outer shapes of the emitter electrode 52, the inner gate metal layer 50-2 and the inner dummy gate metal layer 51-2 are indicated by bold dashed lines. An interlayer dielectric film is provided above the semiconductor substrate 10, but is omitted in FIG. 5b. For example, an interlayer dielectric film is provided between the upper surface of the semiconductor substrate 10 and each of the inner gate metal layer 50-2, the inner dummy gate metal layer 51-2 and the emitter electrode 52, but is omitted in FIG. 5b. Also, an interlayer dielectric film provided between the semiconductor substrate 10 and each of the gate runner 53 and the dummy gate runner 54, and an interlayer dielectric film provided between each of the gate runner 53 and the dummy gate runner 54 and each of the emitter electrode 52, the inner gate metal layer 50-2 and the inner dummy gate metal layer 51-2 are omitted in FIG. 5b.

As described above, the inner gate metal layer 50-2 extends in the Y-axis direction. The inner gate metal layer 50-2 may be electrically connected, via the contact hole 76, to each gate trench portion 40 in the transistor sections 70. The inner gate metal layer 50-2 has the second gap 19. Two portions of the inner gate metal layer 50-2 between which the second gap 19 is disposed are electrically connected by the gate runner 53, which is formed of a conductive material such as polysilicon. The inner gate metal layer 50-2 and the gate runner 53 are electrically connected by the contact hole 74 formed in the interlayer dielectric film.

In the present example, the emitter electrode 52 is divided into a plurality of regions by the inner gate metal layer 50-2 and the gate runner 53. In the example of FIG. 5b, a first region 52-1 and a second region 52-2 are shown. The emitter electrode 52 includes a connecting region 52-4 traversing a region above the gate runner 53 in the X-axis direction and connecting the first region 52-1 and the second region 52-2. The first region 52-1, the second region 52-2 and the connecting region 52-4 may be integrally formed of the same material.

The gate runner 53 may be a wire that is formed of polysilicon or the like and is provided between the semiconductor substrate 10 and each of the inner gate metal layer 50-2 and the connecting region 52-4 via the interlayer dielectric film. In another example, the gate runner 53 may be a trench-type runner formed in the semiconductor substrate 10.

In the present example, the inner gate metal layer 50-2 is disposed between portions of the inner dummy gate metal layer 51-2 in the X-axis direction. The gate runner 53 is disposed between portions of the dummy gate runner 54 in the X-axis direction. The respective structures of the inner dummy gate metal layer 51-2 and the dummy gate runner 54 are similar to those in the example shown in FIG. 4c.

The above-described structure allows the regions of the emitter electrode 52 to be connected by the metallic connecting region 52-4. This achieves a uniform potential of the emitter electrode 52 and improves thermal conduction between its regions. Also, providing the connecting region 52-4 of the emitter electrode 52 and each of the gate runner 53 and the dummy gate runner 54 to cross in a bridged manner allows the portions of the inner gate metal layer 50-2 separated by the connecting region 52-4 to be electrically connected to each other and the portions of the inner dummy gate metal layer 51-2 separated by the connecting region 52-4 to be electrically connected to each other.

Figure 5C:
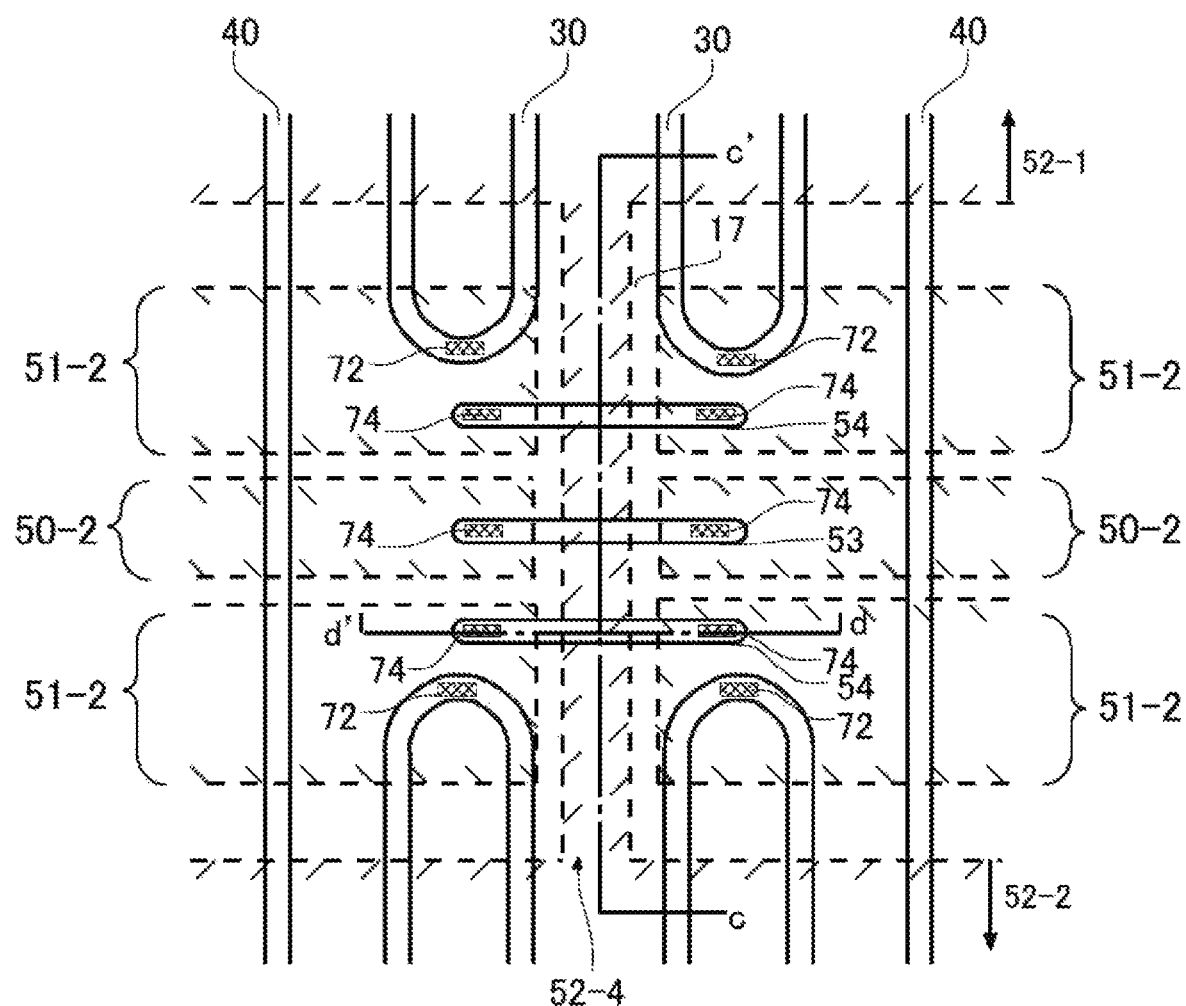
FIG. 5c shows a region near the first gap 17 and the second gap 19 at a further enlarged scale.

FIG. 5c shows a region near the first gap 17 and the second gap 19 at a further enlarged scale. In FIG. 5c, cross section c-c' is a cross section that traverses the connecting region 52-4 of the emitter electrode 52 in the X-axis direction. Cross section d-d' is a cross section that traverses the dummy gate runner 54 in the Y-axis direction.

Figure 5D:
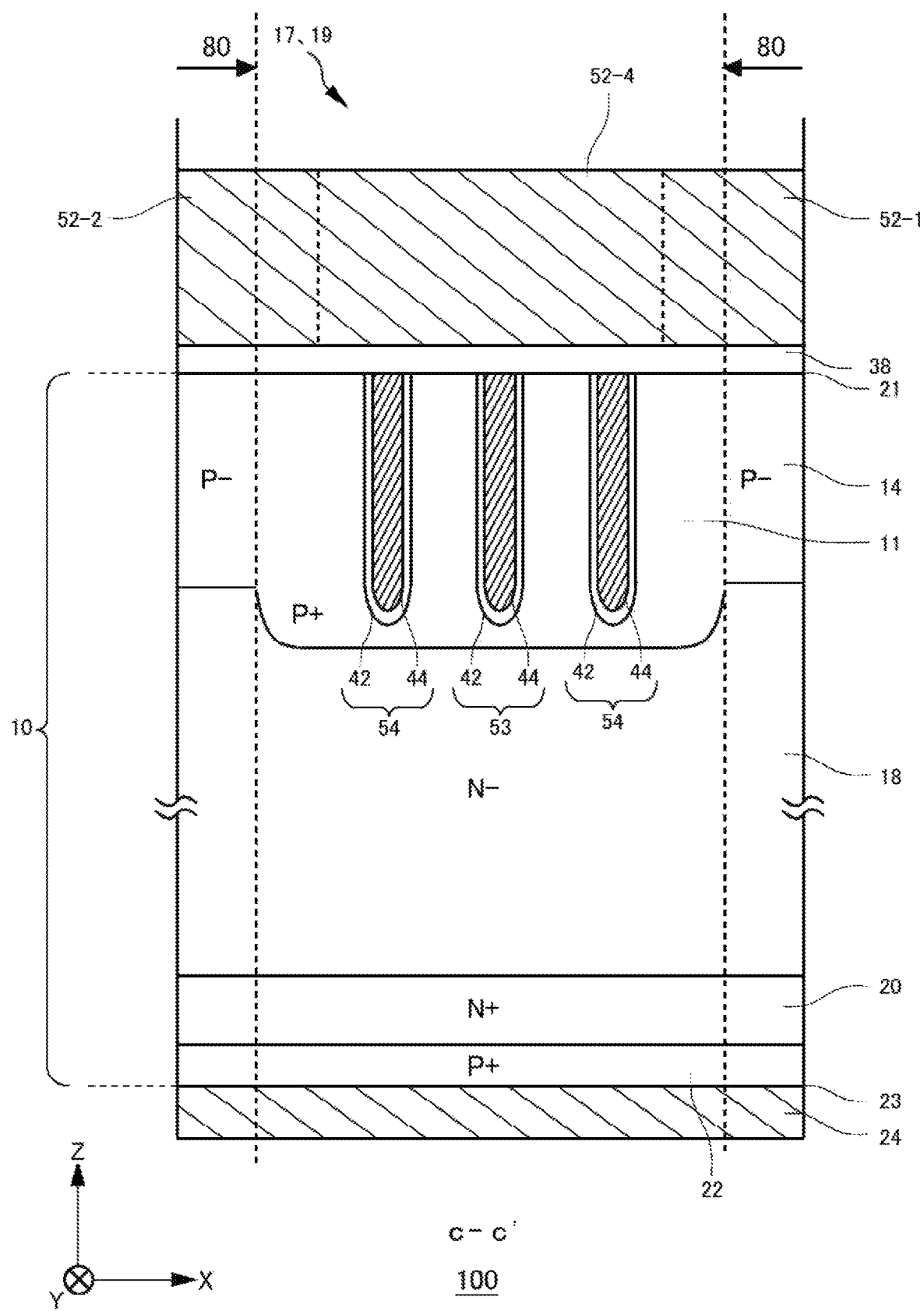
FIG. 5d shows an example of cross section c-c' from FIG. 5c.

FIG. 5d shows cross section c-c' from FIG. 5c. In the present example, the gate runner 53 and the dummy gate runner 54 are trench-type runners. Each of the gate runner 53 and the dummy gate runner 54 includes a trench formed from the upper surface 21 of the semiconductor substrate 10 to the inside of the semiconductor substrate 10, an insulating film 42 formed on the inner wall of the trench, and a conductive portion 44 covered by the insulating film 42. Each of the gate runner 53 and the dummy gate runner 54 is entirely formed inside the well region 11.

Each of the gate runner 53 and the dummy gate runner 54 extends in the Y-axis direction. An interlayer dielectric film 38 is provided on the upper surface 21 of the semiconductor substrate 10, and the connecting region 52-4 extends above the interlayer dielectric film 38 in the X-axis direction.

The above-described structure allows the gate runner 53 and the dummy gate runner 54 to cross the connecting region 52-4 of the emitter electrode 52 in a bridged manner. Moreover, designing the gate runner 53 and the dummy gate runner 54 as trench-type runners allows the structures on the upper surface 21 of the semiconductor substrate 10 to be more flattened.

Figure 5E:
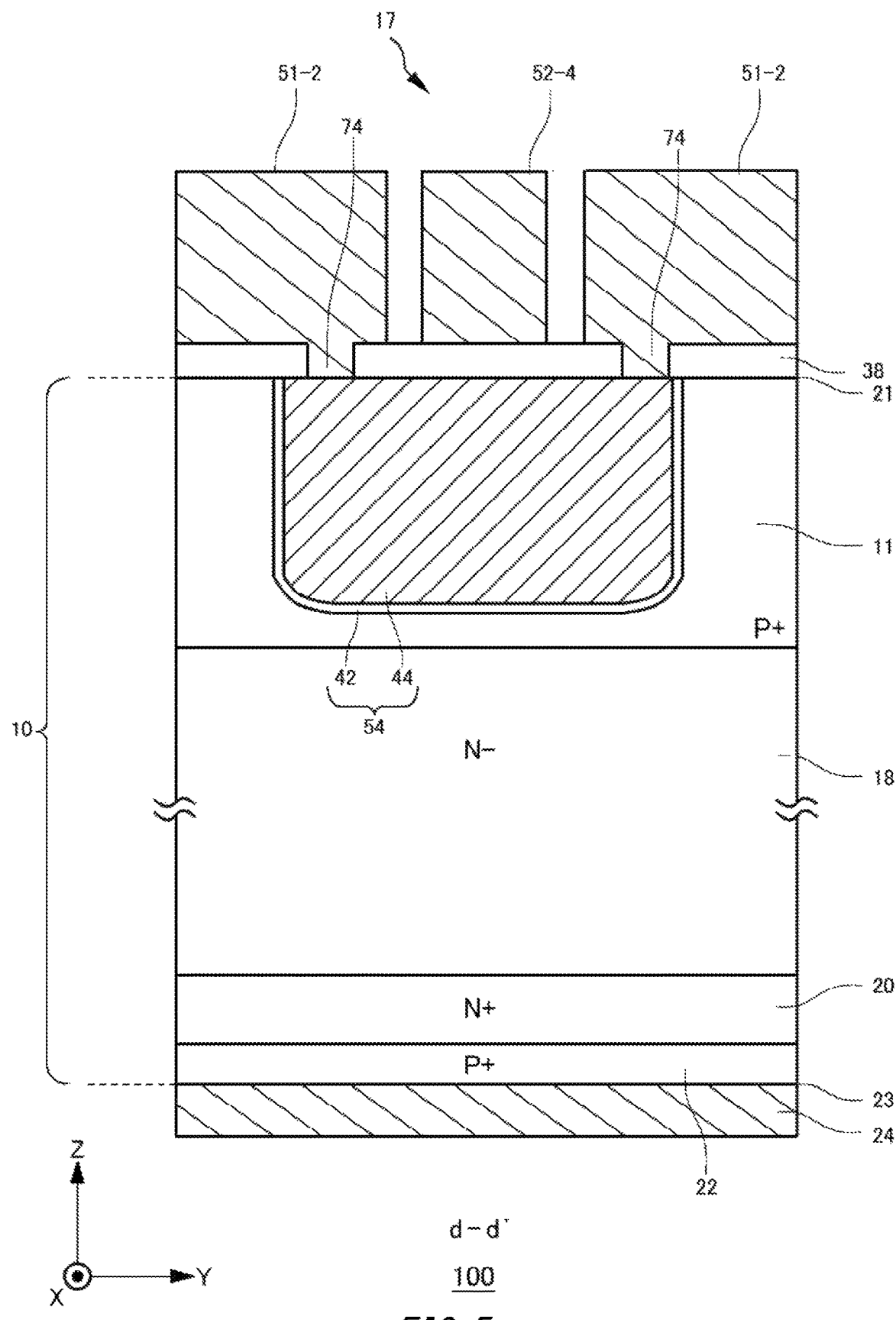
FIG. 5e shows an example of cross section d-d' from FIG. 5c.

FIG. 5e shows cross section d-d' from FIG. 5c. As described above, the dummy gate runner 54 may be a trench-type runner formed in the semiconductor substrate 10. The dummy gate runner 54 is electrically connected, via the contact hole 74, to the two portions of the inner dummy gate metal layer 51-2 arranged on both sides of the first gap 17 in the Y-axis direction. The dummy gate runner 54 traverses a region below the connecting region 52-4 in the Y-axis direction, and the connecting region 52-4 traverses a region above the dummy gate runner 54 in the X-axis direction. This structure allows two regions of the emitter electrode 52 to be connected by a metal component while securing the electrical connection of the inner dummy gate metal layer 51-2.

Figure 6:
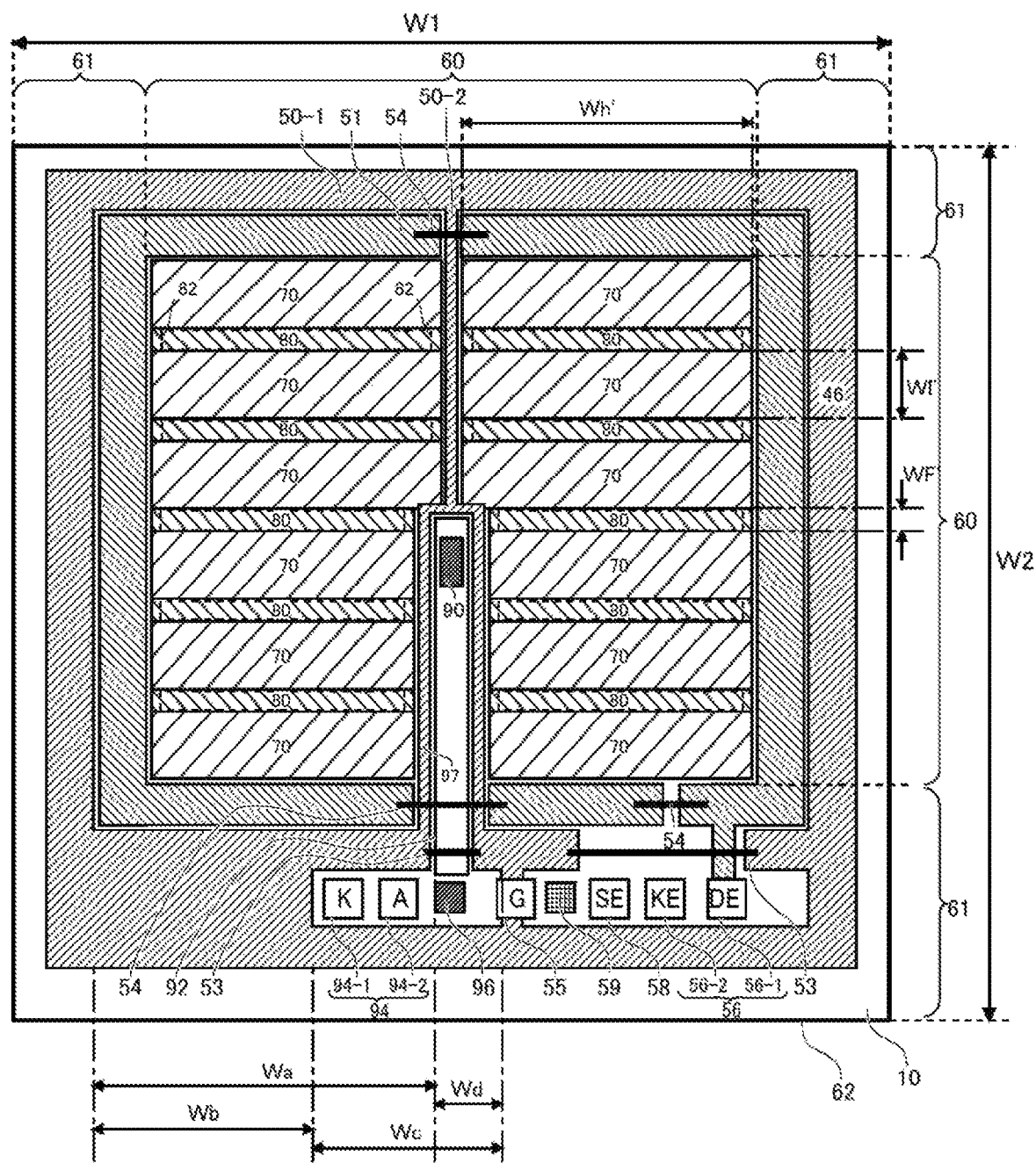
FIG. 6 shows another example of the upper surface of the semiconductor device 100 according to the present embodiment.

FIG. 6 shows another example of the upper surface of the semiconductor device 100 according to the present embodiment. In the semiconductor device 100 of the present example, the long sides of the transistor sections 70 and the diode sections 80 are provided along the Y-axis direction. As compared to the semiconductor device 100 shown in FIG. 5a, the orientation of the transistor sections 70 and the diode sections 80 differs by 90 degrees.

The gate metal layer 97, which is provided along the temperature-sensing wire 92, may be provided to surround the temperature-sensing wire 92. Two portions of the gate metal layer 97 between which the temperature-sensing wire 92 is disposed in the Y-axis direction may extend substantially parallel to the extending direction of the temperature-sensing wire 92. The gate metal layer 97 may be electrically connected, by the inner gate metal layer 50-2, to the portion of the outer gate metal layer 50-1 that is one of the two portions of the outer gate metal layer 50-1 extending in the Y-axis direction and is arranged opposite to the temperature-sensing wire 92 in top view of the semiconductor substrate 10.

The temperature-sensing unit 90 may be provided adjacent to transistor sections 70 in the Y-axis direction. That is, the temperature-sensing unit 90 is disposed between two transistor sections 70 adjacent in the Y-axis direction in top view of the semiconductor substrate 10. The transistor sections 70 occupy more than half the area of the active section 60, and the temperature of the active section 60 is more dependent on the temperature near the transistor sections 70 than near the diode sections 80. Thus, according to the semiconductor device 100 of the present example, the temperature of the active section 60 can be measured more accurately.

Figure 7A:
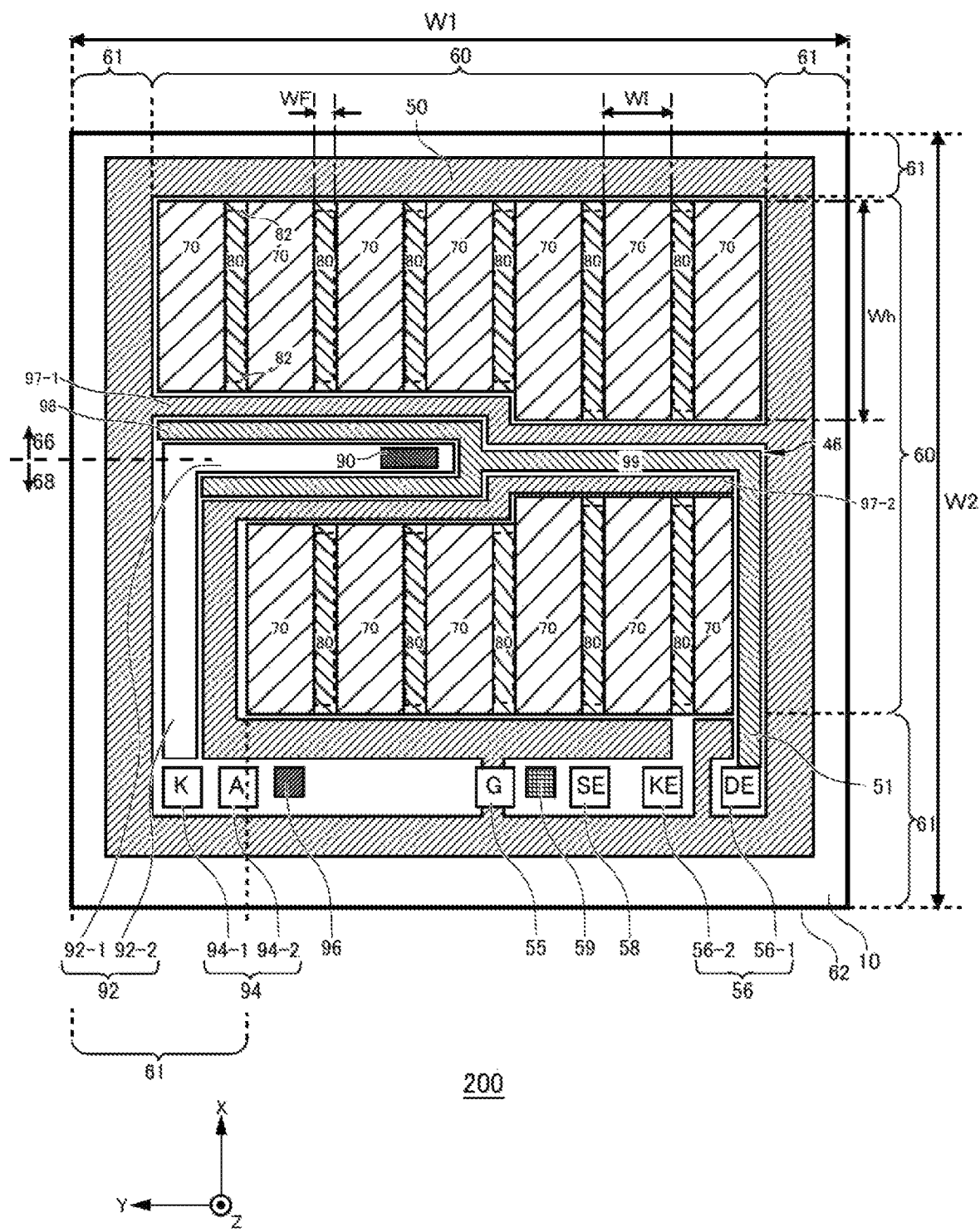
FIG. 7a shows an example of the upper surface of a semiconductor device 200 according to the present embodiment.

FIG. 7a shows an example of the upper surface of a semiconductor device 200 according to the present embodiment. The semiconductor device 200 is different from the semiconductor device 100 in the structure of the temperature-sensing wire 92. In the present example, the temperature-sensing wire 92 includes a temperature-sensing wire 92-1 and a temperature-sensing wire 92-2. The temperature-sensing wire 92-1 is connected to the temperature-sensing unit 90, and extends in the array direction (the Y-axis direction) in the active section 60. The temperature-sensing wire 92-2 extends in the X-axis direction, and connects an end of the temperature-sensing wire 92-1 and the temperature-measurement pad 94. The temperature-sensing wire 92-1 corresponds to the longitudinal portion 93 (refer to FIG. 1a), which is provided from the temperature-sensing unit 90 toward the peripheral region 61. The temperature-sensing wire 92-2 is provided in the peripheral region 61. The temperature-measurement pad 94 may be one of a plurality of pads that is provided at the outermost position in the Y-axis direction.

A dummy gate metal layer 98 may be provided between the temperature-sensing wire 92-1 and device regions (transistor sections 70 and diode sections 80). In the present example, the temperature-sensing wire 92-1 is disposed between two portions of the dummy gate metal layer 98 in the X-axis direction. The two portions of the dummy gate metal layer 98 extend in the Y-axis direction along the temperature-sensing wire 92-1. The two portions of the dummy gate metal layer 98 are connected to each other near a Y-axis direction end of the temperature-sensing wire 92-1. The dummy gate metal layer 98 may be connected to a dummy gate metal layer 99 extending in the Y-axis direction. The dummy gate metal layer 98 may be provided to surround the temperature-sensing wire 92-1 in the dividing portion 46. The dummy gate metal layer 99 is provided between device regions adjacent in the X-axis direction.

The dummy gate metal layer 99 connects the dummy gate metal layer 98 and a dummy gate metal layer 51. The dummy gate metal layer 51 extends in the X-axis direction. The dummy gate metal layer 51 is provided between the gate metal layer 50 and the active section 60, and is connected to the dummy gate pad 56-1. The dummy gate metal layer 98 and the dummy gate metal layer 99 may be integrally formed of the same material as the dummy gate metal layer 51.

A gate metal layer 97 may be provided between the dummy gate metal layer 98 and device regions. In the present example, the two portions of the dummy gate metal layer 98 and the temperature-sensing wire 92-1 are disposed between two portions of the gate metal layer 97 in the X-axis direction. A gate metal layer 97-1, which is one of the two portions of the gate metal layer 97 and is arranged on the opposite side to the temperature-sensing wire 92-2, may be provided to traverse the active section 60 in the Y-axis direction. A gate metal layer 97-2 arranged on the same side as the temperature-sensing wire 92-2 may include a portion extending in the X-axis direction along the temperature-sensing wire 92-2. The gate metal layer 97-2 may further include a portion extending in the Y-axis direction between the active section 60 and pads. The gate metal layer 97-2 may be connected to the gate pad 55 via these portions. The gate metal layer 97-2 may be arranged along the dummy gate metal layer 99. In the present example, the dummy gate metal layer 99 is disposed between the gate metal layer 97-1 and the gate metal layer 97-2 in the X-axis direction.

In the semiconductor device 200 of the present example, a plurality of transistor sections 70 and a plurality of diode sections 80 may be provided in the active section 60. In the example shown in FIG. 7a, seven transistor sections 70 and six diode sections 80 are provided along the Y-axis direction in a region that is one of the regions of the active section 60 into which the active section 60 is divided by the dividing portion 46 of the temperature-sensing unit 90 or the like and that is on the opposite side to the gate pad 55. Also, in this example, six transistor sections 70 and five diode sections 80 are provided along the Y-axis direction in the region of the active section 60 on the same side as the gate pad 55. The transistor section 70 that is one of the transistor sections 70 in the region of the active section 60 on the same side as the gate pad 55 with respect to the dividing portion 46 and that is closest to the dummy gate metal layer 51 is provided to have a width smaller than width WI of the other transistor sections 70 due to the presence of the dummy gate metal layer 51.

The temperature-sensing unit 90 is provided above the active section 60. The long sides of the temperature-sensing unit 90 in top view may be provided parallel to the array direction of the transistor sections 70 and the diode sections 80 (the Y-axis direction in the present example). The temperature-sensing unit 90 senses the temperature of the active section 60. The temperature-sensing unit 90 may be a temperature-sensing diode formed of silicon.

The gate metal layer 50 may be provided to surround the transistor sections 70 and the diode sections 80 in top view of the semiconductor substrate 10. The gate metal layer 50 is electrically connected to the gate pad 55 provided in the peripheral region 61. In top view of the semiconductor substrate 10, the gate pad 55 may be provided between, in the X-axis direction, two portions of the gate metal layer 50 extending in the Y-axis direction.

The gate metal layer 50 may be formed of aluminum or an aluminum-silicon alloy. The gate metal layer 50 is electrically connected to the transistor sections 70 to supply gate voltages to the transistor sections 70.

The dummy gate metal layer 51 may be provided on the inside of the gate metal layer 50 in top view of the semiconductor substrate 10. The dummy gate metal layer 51 may be provided above the active section 60 to surround the temperature-sensing wire 92 and the gate metal layer 50 extending in the Y-axis direction. The dummy gate metal layer 51 is electrically connected to the dummy gate pad 56-1 provided outside the active section 60.

The dummy gate metal layer 51 is electrically connected to the diode sections 80 to supply dummy gate voltages to the diode sections 80. The dummy gate metal layer 51 may be formed of aluminum or an aluminum-silicon alloy.

In the semiconductor device 200 of the present example, the temperature-sensing wire 92-2 and the temperature-measurement pad 94 are arranged outside the active section 60 and at a Y-axis direction end. In addition, the gate metal layer 97-2 and the dummy gate metal layer 98 are provided along the temperature-sensing wire 92. Thus, the gate runner 53 and the dummy gate runner 54 may not need to be provided across the temperature-sensing wire 92-2. Thus, as compared to the semiconductor device 100 shown in FIG. 1a, the gate voltages supplied to the transistor sections 70 can be uniformed. This can prevent decrease in the withstand capability of the transistor sections 70.

Figure 7B:
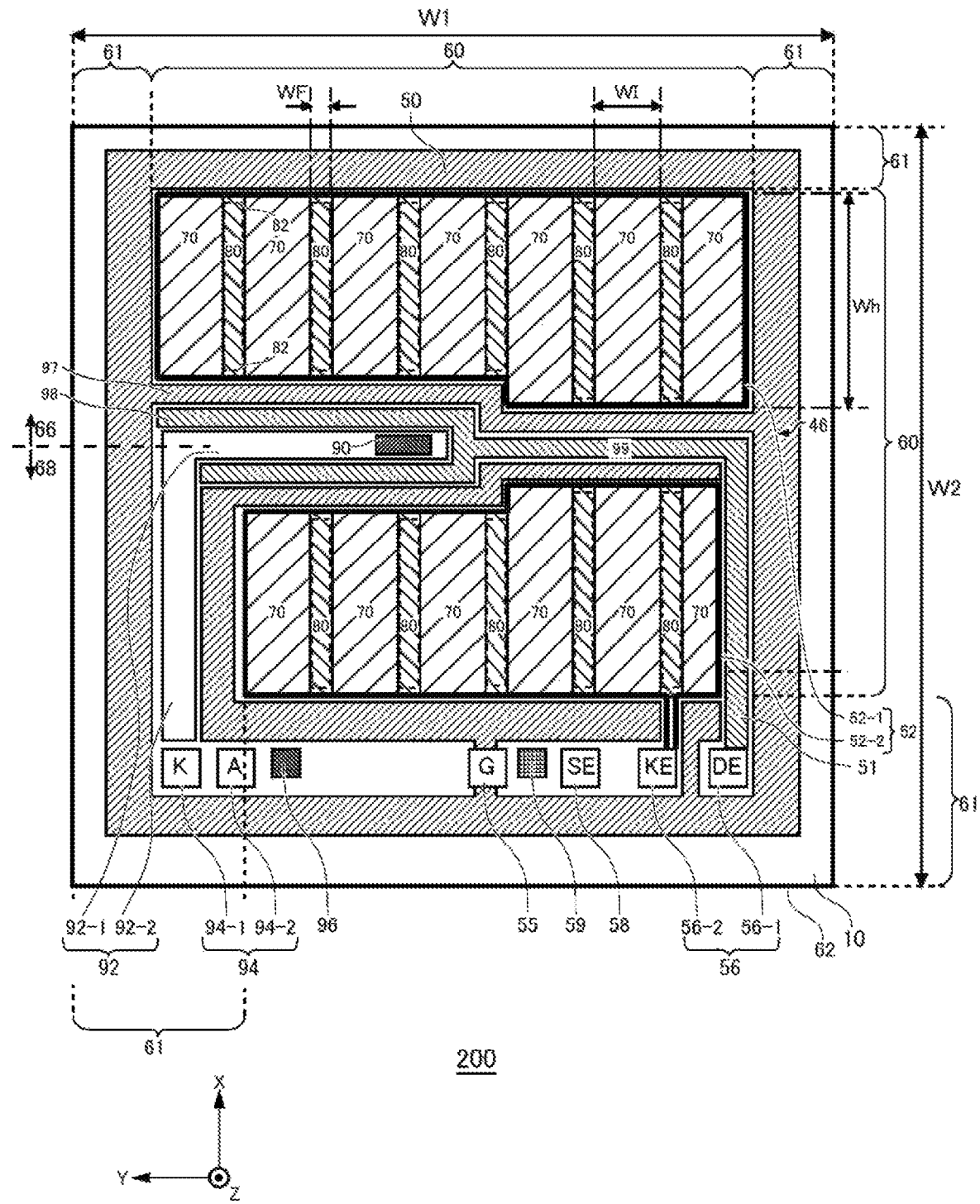
FIG. 7b shows another view of FIG. 7a in which the emitter electrode 52 is added.

FIG. 7b shows another view of FIG. 7a in which the emitter electrode 52 is added. In FIG. 7b, regions in which the emitter electrode 52 is formed are enclosed with thick lines. In the present example, the emitter electrode 52 is divided by the dividing portion 46.

As shown in FIG. 7b, the emitter electrode 52 is provided above the transistor sections 70 and the diode sections 80. The first region 52-1 of the emitter electrode 52 is provided above the transistor sections 70 and diode sections 80 that are on the more positive side in the X-axis direction. The second region 52-2 of the emitter electrode 52 is provided above the transistor sections 70 and diode sections 80 that are on the more negative side in the X-axis direction. The emitter electrode 52 is electrically connected to the Kelvin pad 56-2 provided outside the active section 60. Note that, in the present example as well, the emitter electrode 52 may include the connecting region 52-4 connecting the first region 52-1 and the second region 52-2. In this case, for example, the dummy gate metal layer 99 and the portions of the gate metal layer 97 arranged adjacent to the dummy gate metal layer 99 in the X-axis direction may have a gap.

Figure 8A:
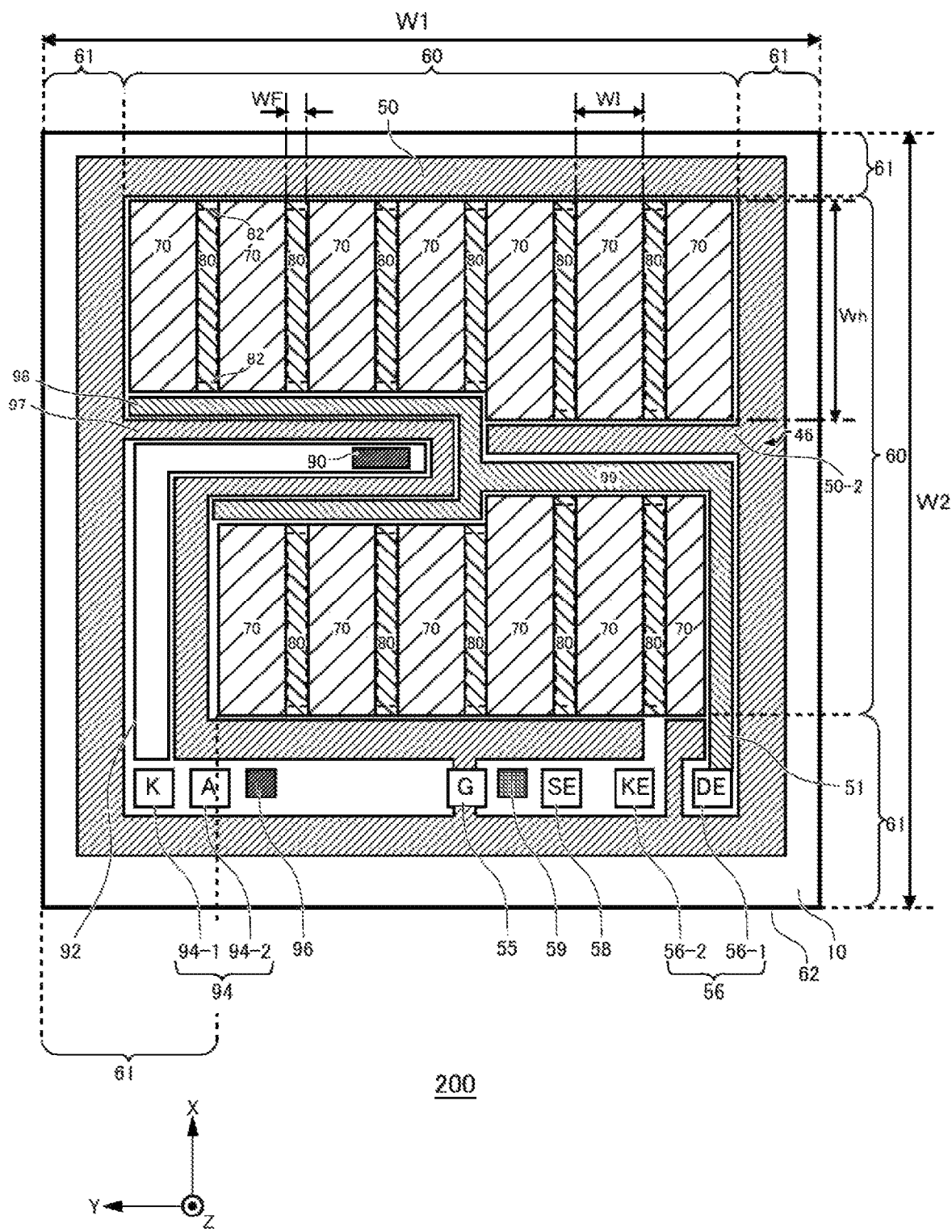
FIG. 8a shows an example of the upper surface of the semiconductor device 200 according to the present embodiment.

FIG. 8a shows another example of the upper surface of the semiconductor device 200 according to the present embodiment. The semiconductor device 200 of the present example is different from the semiconductor device 200 shown in FIG. 7a in that the gate metal layer 97 is provided between the temperature-sensing wire 92-1 and device regions and the dummy gate metal layer 98 is provided between the gate metal layer 97 and device regions.

The arrangement of the temperature-sensing unit 90, the temperature-sensing wire 92 and the temperature-measurement pad 94 in the present example is the same as that in the example shown in FIG. 7a. In the present example, the gate metal layer 97 is arranged to surround the temperature-sensing wire 92. The temperature-sensing wire 92 and the gate metal layer 97 are disposed between two portions of the dummy gate metal layer 98 in the X-axis direction. The two portions of the dummy gate metal layer 98 are connected to the dummy gate metal layer 99 near an end of the temperature-sensing wire 92. The gate metal layer 50 may include an inner gate metal layer 50-2 extending in the Y-axis direction along the dummy gate metal layer 99. In the present example as well, the gate voltages supplied to the transistor sections 70 can be uniformed. This can prevent decrease in the withstand capability of the transistor sections 70.

Figure 8B:
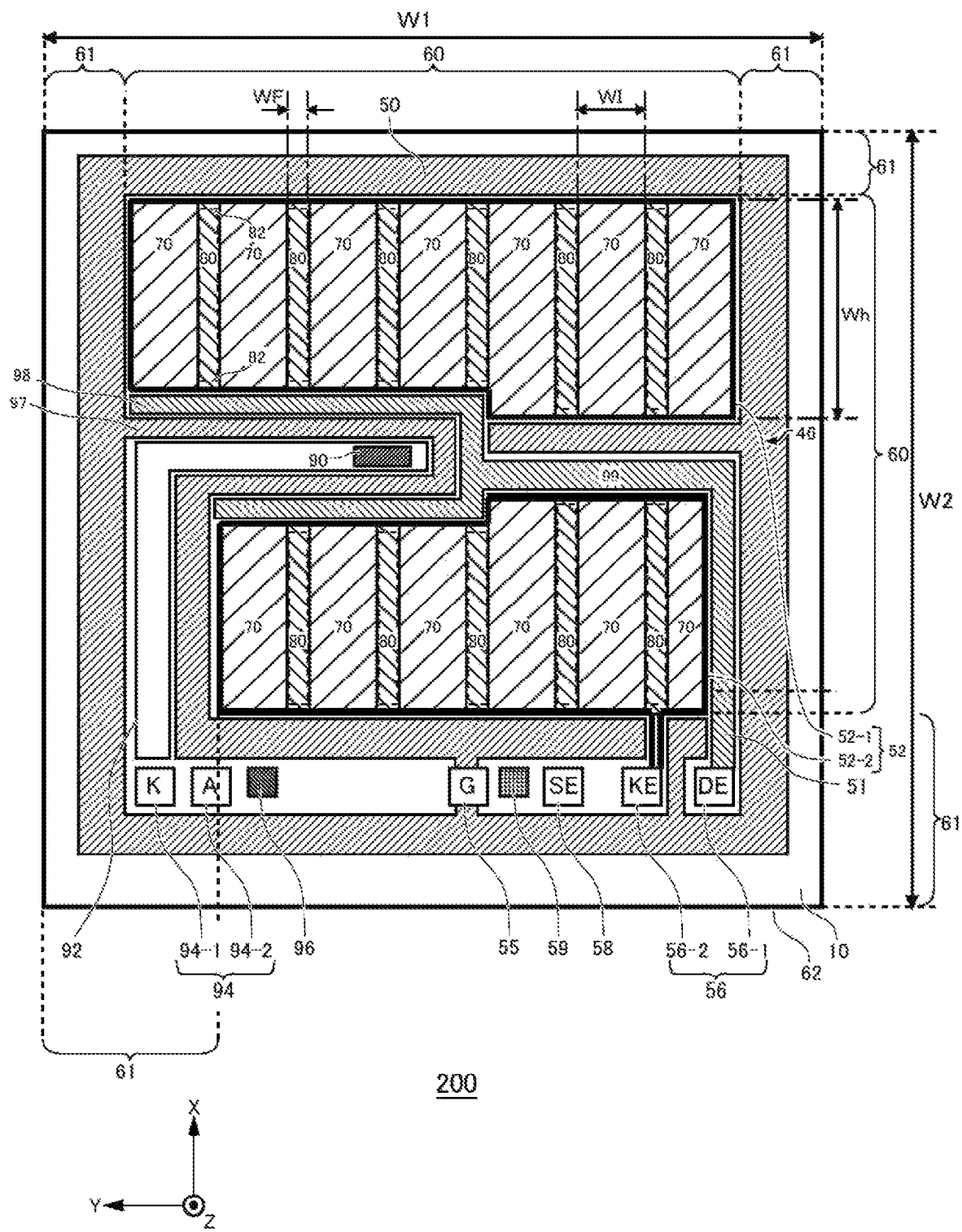
FIG. 8b shows another view of FIG. 8a in which the emitter electrode 52 is added.

FIG. 8b shows another view of FIG. 8a in which the emitter electrode 52 is added. In FIG. 8b, regions in which the emitter electrode 52 is formed are enclosed with thick lines. In the present example, the emitter electrode 52 is divided by the dividing portion 46.

As shown in FIG. 8b, the emitter electrode 52 is provided above the transistor sections 70 and the diode sections 80. The first region 52-1 of the emitter electrode 52 is provided above the transistor sections 70 and diode sections 80 that are on the more positive side in the X-axis direction. The second region 52-2 of the emitter electrode 52 is provided above the transistor sections 70 and diode sections 80 that are on the more negative side in the X-axis direction. The emitter electrode 52 is electrically connected to the Kelvin pad 56-2 provided outside the active section 60. Note that, in the present example as well, the emitter electrode 52 may include the connecting region 52-4 connecting the first region 52-1 and the second region 52-2. In this case, for example, the dummy gate metal layer 99 and the portions of the inner gate metal layer 50-2 arranged adjacent to the dummy gate metal layer 99 in the X-axis direction may have a gap.

Figure 9:
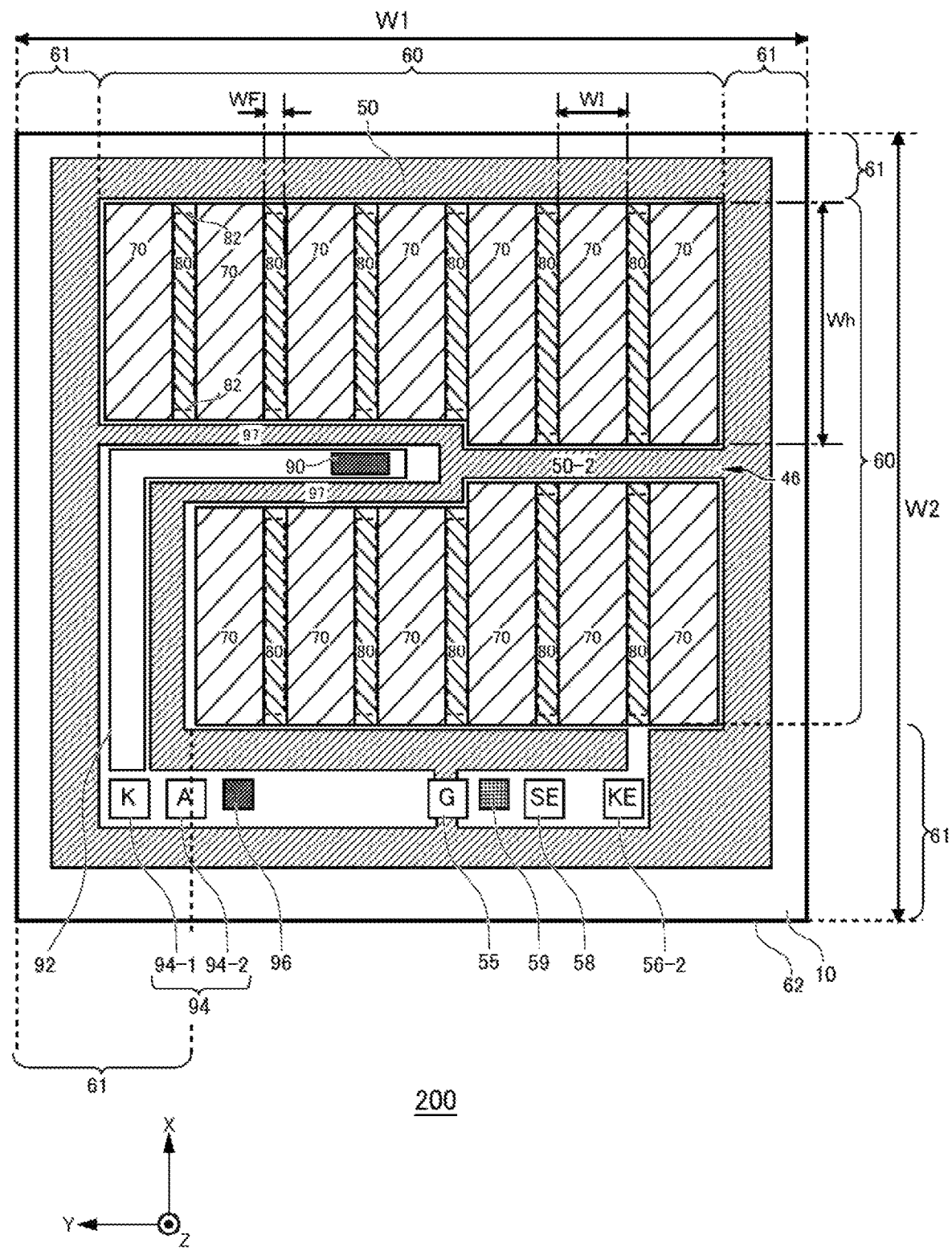
FIG. 9 shows another example of the upper surface of the semiconductor device 200 according to the present embodiment.

FIG. 9 shows another example of the upper surface of the semiconductor device 200 according to the present embodiment. The semiconductor device 200 of the present example is different from the semiconductor device 200 shown in FIG. 8a in that the dummy gate metal layer 51 and the dummy gate pad 56-1 in the semiconductor device 200 shown in FIG. 8a are not provided. In the present example, the gate metal layer 97 is connected to the inner gate metal layer 50-2. In the present example, the inner gate metal layer 50-2 is disposed between two device regions (transistor sections 70 or diode sections 80). The inner gate metal layer 50-2 may be at the same X-axis direction position as the temperature-sensing unit 90.

Since the semiconductor device 200 of the present example does not include the dummy gate metal layer 51, the gate metal layer 50 can be provided over a larger area than in the semiconductor device 200 shown in FIG. 8a. Thus, as compared to the semiconductor device 200 shown in FIG. 8a, the gate voltages supplied to the transistor sections 70 can be uniformed. This can prevent decrease in the withstand capability of the transistor sections 70. Note that, in the semiconductor device 200 of the present example, the emitter electrode 52 is divided by the dividing portion 46, similar to the semiconductor device 200 shown in FIG. 8b.

Also, since the semiconductor device 200 of the present example does not include the dummy gate metal layer 51, the area of the transistor sections 70 and the diode sections 80 can be increased as compared to the semiconductor device 200 shown in FIG. 8a.

Figure 10:
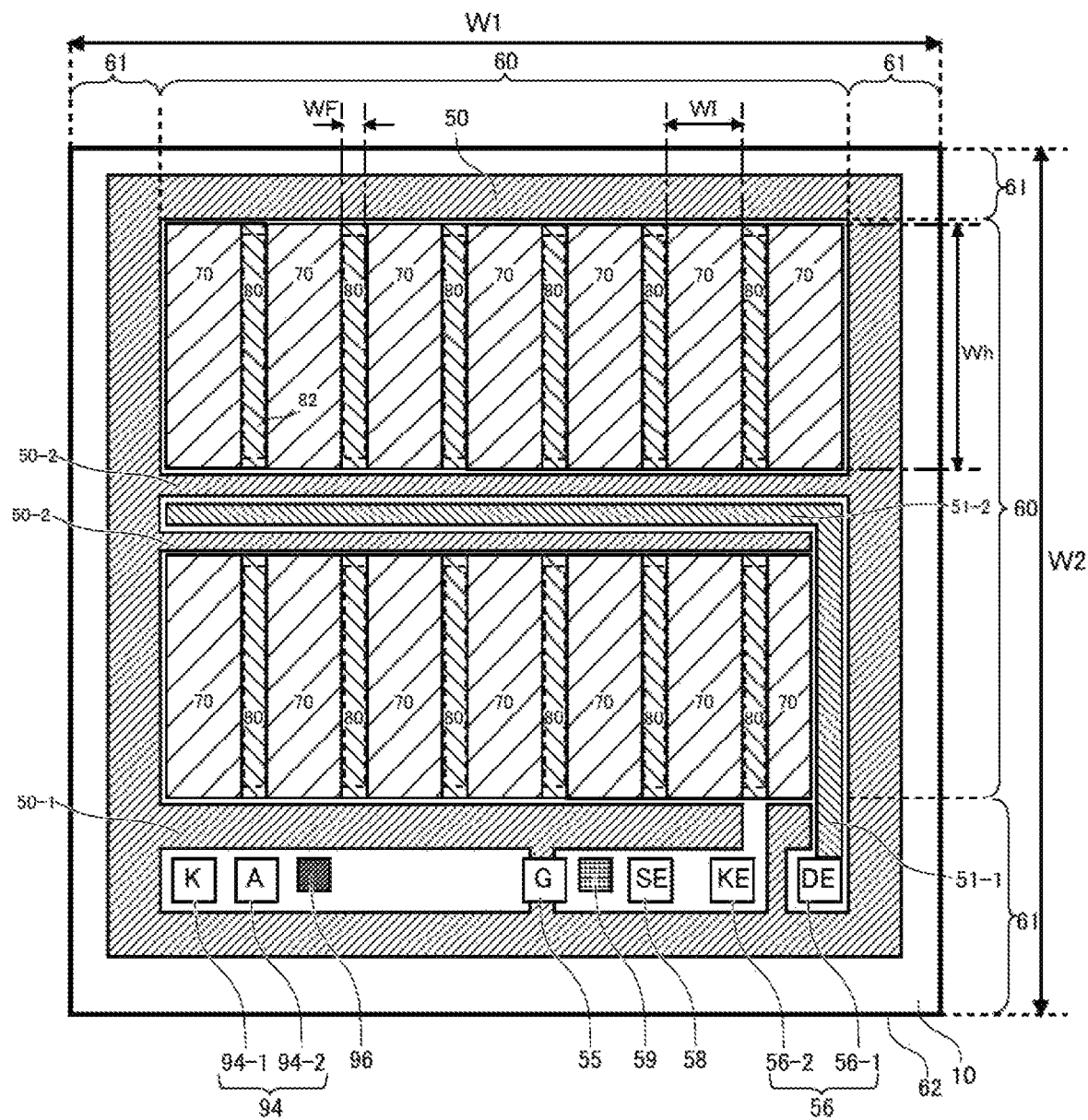
FIG. 10 is a top view showing another example structure of the semiconductor device 200.

FIG. 10 is a top view showing another example structure of the semiconductor device 200. In the semiconductor device 200 of the present example, the sensor 96 serves as the temperature-sensing unit 90. The semiconductor device 200 of the present example does not include the temperature-sensing unit 90 and the temperature-sensing wire 92 in the active section 60. The sensor 96 is provided in the peripheral region 61 between the gate pad 55 and the temperature-measurement pad 94. The sensor 96 and the temperature-measurement pad 94 are electrically connected to the temperature-measurement pad 94 through an electrically conductive wire. The electrically conductive wire (not shown) connecting the sensor 96 and the temperature-measurement pad 94 may be formed of polysilicon. The sensor 96 outputs a current based on a temperature-sensing result. The output current flows through the electrically conductive wire and reaches the temperature-measurement anode pad 94-2.

In the present example, the gate metal layer 50 includes an outer gate metal layer 50-2 extending in the Y-axis direction to the gate pad 55 through a region between the active section 60 and each of the temperature-measurement pad 94 and the sensor 96. Thus, the gate runner 53 may not need to be provided across the temperature-sensing wire. This can uniformize the gate voltages supplied to the transistor sections 70 and prevent decrease in the withstand capability of the transistor sections 70.

In the present example, the outer dummy gate metal layer 51-1 extends from the dummy gate pad 56-1 in the X-axis direction. The inner dummy gate metal layer 51-2 extending in the Y-axis direction is connected an X-axis direction end of the outer dummy gate metal layer 51-1. The semiconductor device 200 of the present example includes two portions of the inner gate metal layer 50-2 extending in the Y-axis direction. The inner dummy gate metal layer 51-2 is disposed between the two portions of the inner gate metal layer 50-2. The portion of the inner gate metal layer 50-2 arranged on the opposite side to the outer dummy gate metal layer 51-1 relative to the inner dummy gate metal layer 51-2 is provided to traverse the entire active section 60 in the Y-axis direction. The portion of the inner gate metal layer 50-2 arranged on the same side as the outer dummy gate metal layer 51-1 is provided from the portion of the outer gate metal layer 50-1 opposite the outer dummy gate metal layer 51-1 in the Y-axis direction to a position opposing the transistor section 70 closest to the outer dummy gate metal layer 51-1. However, this portion of the inner gate metal layer 50-2 is not in contact with the outer dummy gate metal layer 51-1.

Figure 11:
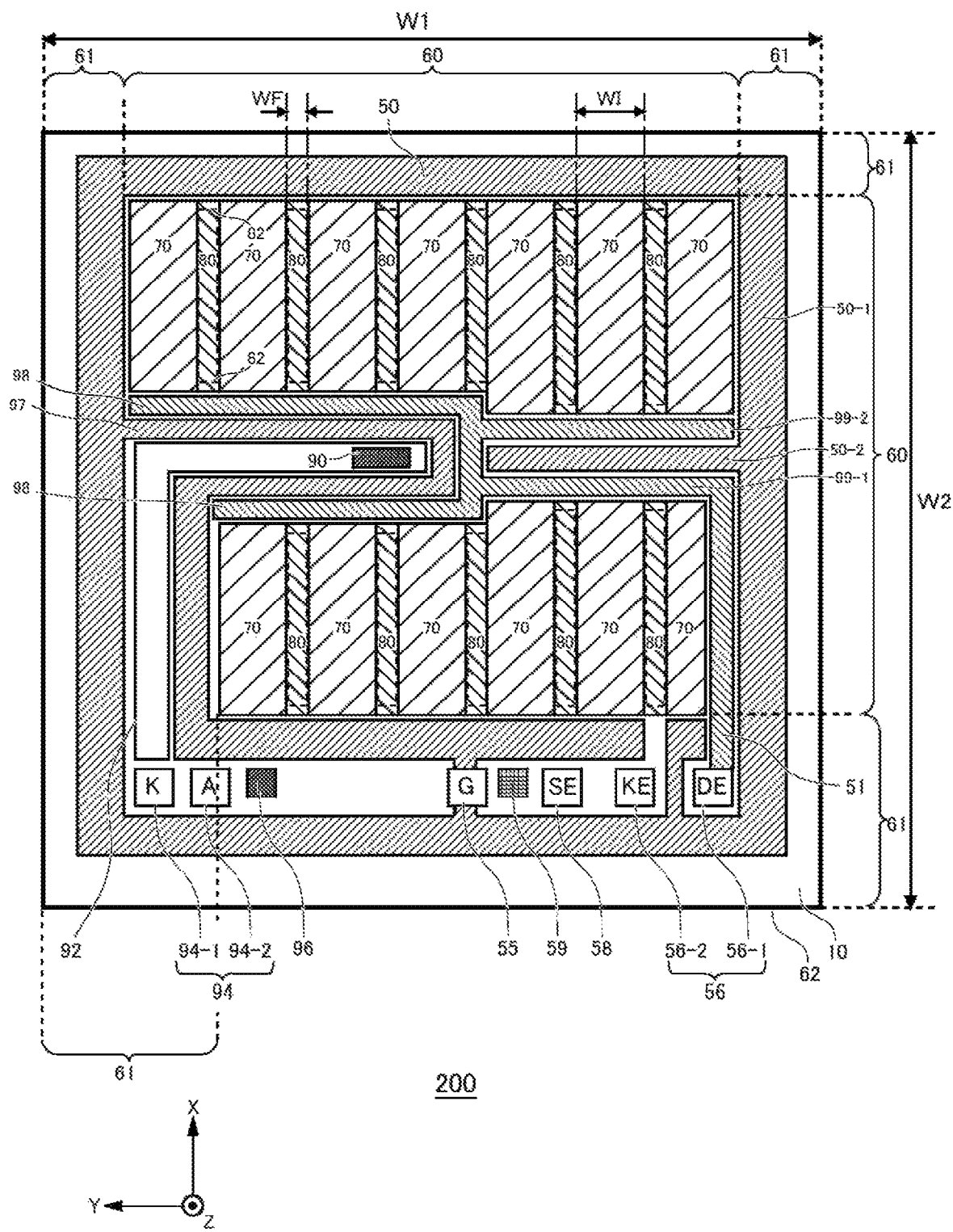
FIG. 11 is a top view showing another example structure of the semiconductor device 200.

FIG. 11 is a top view showing another example structure of the semiconductor device 200. The semiconductor device 200 of the present example further includes a dummy gate metal layer 99-2 as compared to the semiconductor device 200 shown in FIG. 8a. Other structures are the same as those in the semiconductor device 200 shown in FIG. 8a.

In the present example, the inner gate metal layer 50-2 is disposed between the dummy gate metal layer 99-1 and the dummy gate metal layer 99-2 in the X-axis direction. The dummy gate metal layer 99-2 extends in the Y-axis direction from the dummy gate metal layer 98 to a position opposing the transistor section 70 closest to the outer gate metal layer 50-1. However, the dummy gate metal layer 99-2 is not in contact with the outer gate metal layer 50-1. According to the present example, the dummy gate metal layer can easily be connected to the transistor sections 70.

Figure 12:
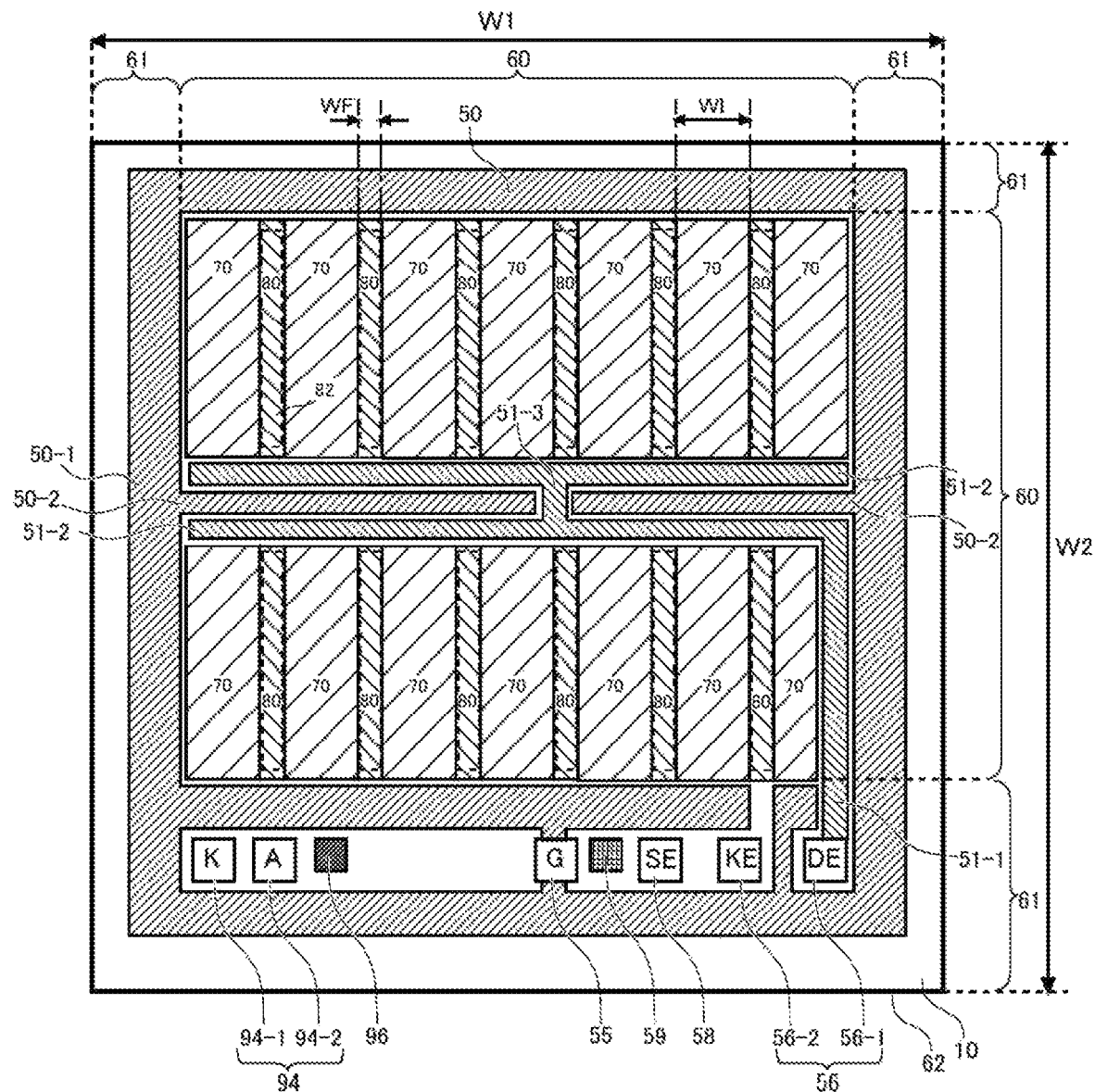
FIG. 12 is a top view showing another example structure of the semiconductor device 200.

FIG. 12 is a top view showing another example structure of the semiconductor device 200. The semiconductor device 200 of the present example differs from the semiconductor device 200 shown in FIG. 10 in the structures of the inner gate metal layer 50-2 and the inner dummy gate metal layer 51-2. Other structures are the same as those in the semiconductor device 200 shown in FIG. 10.

The semiconductor device 200 of the present example includes two portions of the inner dummy gate metal layer 51-2 extending in the Y-axis direction. In the Y-axis direction, each portion of the inner dummy gate metal layer 51-2 extends from a position opposing the transistor section 70 arranged at one end of the active section 60 to a position opposing the transistor section 70 arranged at the other end. The one of the two portions of the inner dummy gate metal layer 51-2 that is closer to the outer dummy gate metal layer 51-1 is connected to the outer dummy gate metal layer 51-1. The two portions of the inner dummy gate metal layer 51-2 are connected to each other by an inner dummy gate metal layer 51-3 extending in the X-axis direction. The inner dummy gate metal layer 51-3 may be arranged at the Y-axis direction center of the active section 60.

The inner gate metal layer 50-2 is arranged between the two portions of the inner dummy gate metal layer 51-2. The inner gate metal layer 50-2 is provided to traverse the active section 60 in the Y-axis direction. However, the inner gate metal layer 50-2 is divided by the inner dummy gate metal layer 51-3. That is, the inner gate metal layer 50-2 extends from the outer gate metal layer 50-1 to a position near the inner dummy gate metal layer 51-3.

Figure 13:
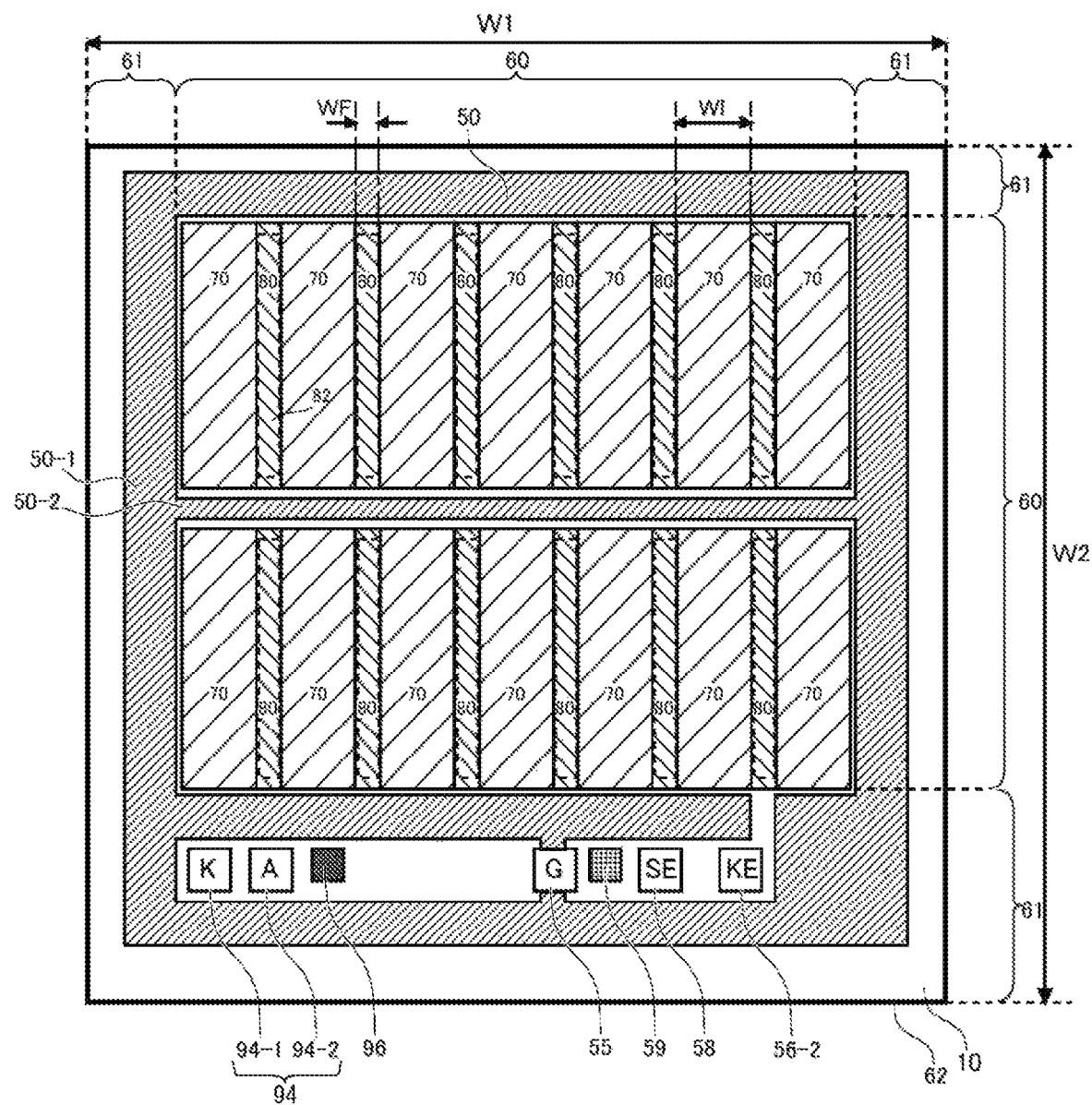
FIG. 13 is a top view showing another example structure of the semiconductor device 200.

FIG. 13 is a top view showing another example structure of the semiconductor device 200. The semiconductor device 200 of the present example differs from the semiconductor device 200 shown in FIG. 10 in the structure of the inner gate metal layer 50-2. Also, the semiconductor device 200 of the present example does not include the dummy gate pad 56-1 and the dummy gate metal layer. Other structures are the same as those in the semiconductor device 200 shown in FIG. 10. In the present example, the inner gate metal layer 50-2 traverses the active section 60 in the Y-axis direction. The inner gate metal layer 50-2 may be arranged at the X-axis direction center of the active section 60.

Figure 14:
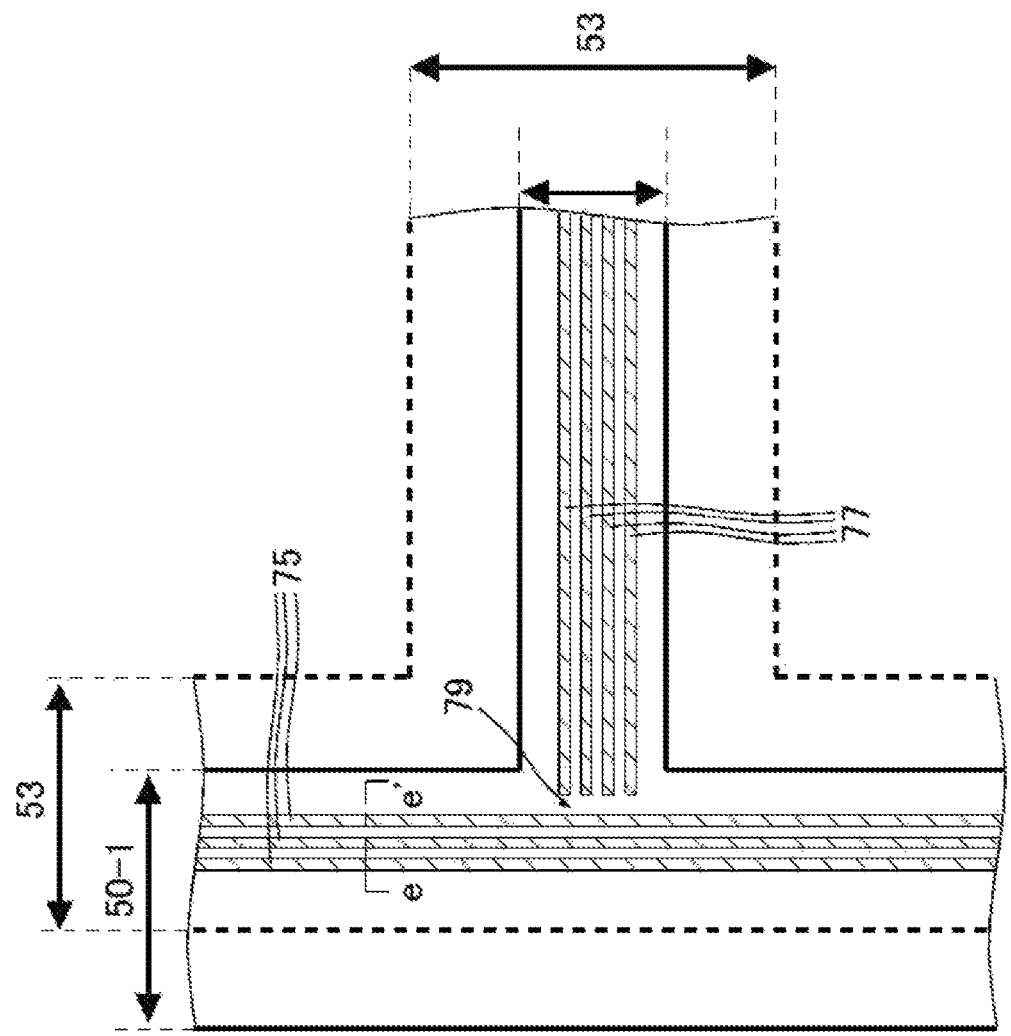
FIG. 14 shows the intersection of an outer gate metal layer 50-1 and an inner gate metal layer 50-2 at an enlarged scale.

FIG. 14 shows the intersection of the outer gate metal layer 50-1 and the inner gate metal layer 50-2 at an enlarged scale. In the present example, the gate runner 53 is arranged to overlap the outer gate metal layer 50-1 and the inner gate metal layer 50-2. In the present example, the gate runner 53 is a wire that is formed of polysilicon or the like and is arranged between the gate metal layer 50 and the semiconductor substrate 10. In the present example, the gate runner 53 is arranged along the gate metal layer 50. That is, if the gate metal layer 50 branches in a T-shape, the gate runner 53 is similarly provided in a branched manner. In the present example, the gate runner 53 is provided to extend closer to the transistor section 70 than the gate metal layer 50 in top view. The gate runner 53 is connected to the gate trench portions 40 in the transistor sections 70.

The gate runner 53 and the gate metal layer 50 are insulated from each other by an interlayer dielectric film or the like. One or more contact holes 75 and one or more contact holes 77 are provided in the interlayer dielectric film. The contact holes 75 and the contact holes 77 may be filled with the same conductive material as the gate metal layer 50, or may be filled with a different conductive material such as tungsten. The contact holes 75 connect the gate runner 53 and the outer gate metal layer 50-1. The contact holes 77 connect the gate runner 53 and the inner gate metal layer 50-2. A plurality of contact holes 75 and a plurality of contact holes 77 may be provided in parallel with each other.

The contact holes 75 and the contact holes 77 are provided along the gate metal layer 50. However, the contact holes 75 and the contact holes 77 are not connected at the position where the gate metal layer 50 branches. That is, a gap 79 is provided between the contact holes 75 and the contact holes 77. An interlayer dielectric film or the like is arranged in the gap 79.

Figure 15:
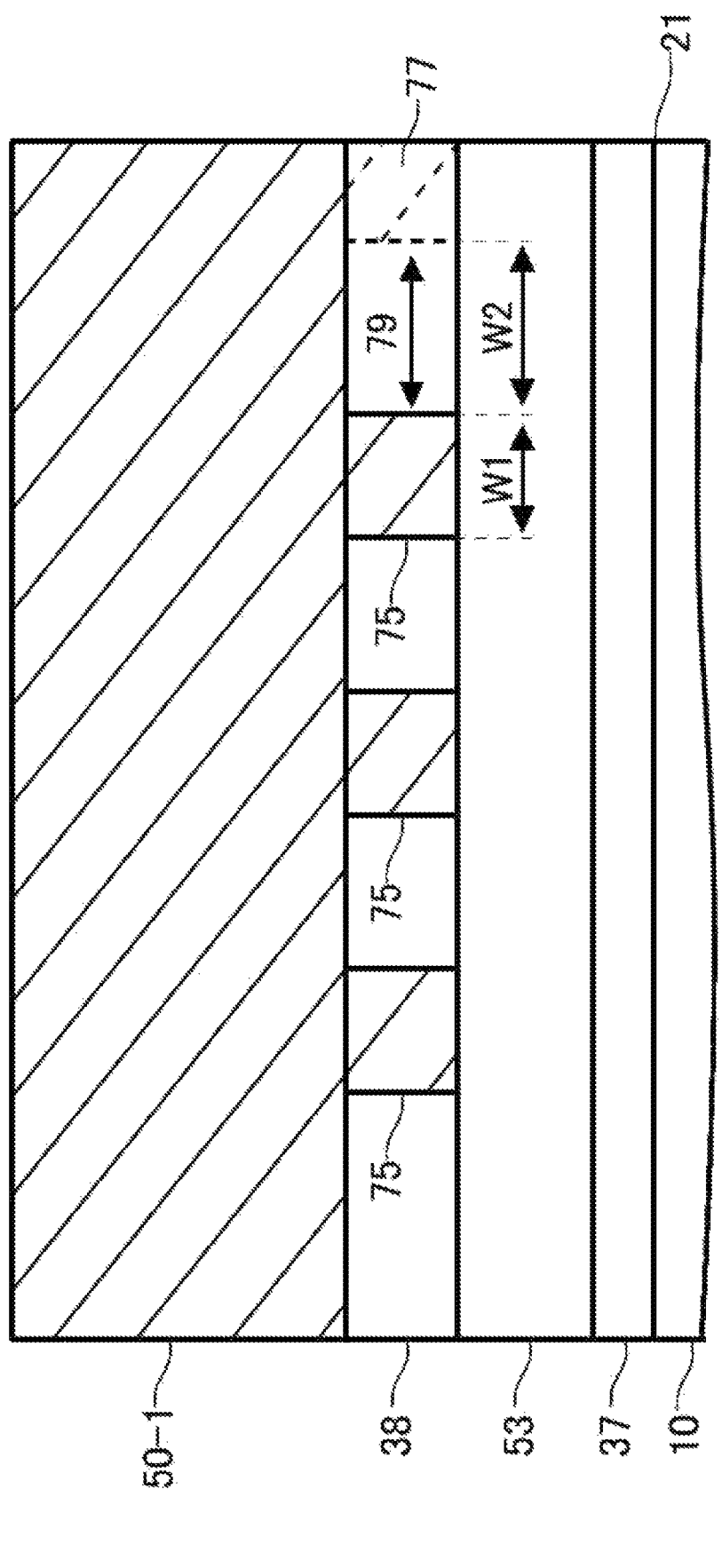
FIG. 15 shows an example of cross section e-e' from FIG. 14.

FIG. 15 shows an example of cross section e-e' from FIG. 14. Cross section e-e' is in a Y-Z plane including contact holes 75. In FIG. 15, the projection of the contact holes 77 onto the cross section is indicated by dotted lines.

As described above, the interlayer dielectric film 38 is provided between the gate metal layer 50 and the gate runner 53. The gate metal layer 50 and the gate runner 53 are connected through the contact holes 75 and the contact holes 77 provided in the interlayer dielectric film 38. Also, an insulating film 37 such as an oxide film is provided between the semiconductor substrate 10 and the gate runner 53.

In the present example, the contact holes 75 are longer in the X-axis direction. In a plane parallel to the upper surface 21 of the semiconductor substrate 10, the width of each contact hole 75 in a direction perpendicular to the longitudinal direction (the Y-axis direction in the present example) is referred to as width W1. Width W1 may be the width of the contact hole 75 at the position in contact with the upper surface 21 of the semiconductor substrate 10. The shortest distance between the contact holes 75 and the contact holes 77 is referred to as width W2. Width W2 may be the distance in the Y-axis direction between an end of the contact holes 75 and an end of the contact holes 77 at the position in contact with the upper surface 21 of the semiconductor substrate 10.

Width W2 may be larger than width W1. In the process of patterning a resist with a mask, a contact hole 75 and a contact hole 77 may be connected due to misalignment. The connected contact holes would have an increased width. As a result, the gate metal layer 50 may not be filled to form a gap between the gate metal layer 50 and the gate runner 53, so that the gate metal layer 50 may not be in contact with the gate runner 53. Designing width W2 to be larger width W1 can prevent a gap from being formed between the gate metal layer 50 and the gate runner 53, securing a good electrical connection.

The end of the contact holes 77 facing the contact holes 75 may be positioned inside the gate metal layer 50-1 along the longitudinal direction in top view. The gate runner 53 positioned below the gap 79 is locally separated from the gate metal layer 50-1. Since the gate runner 53 has a higher resistance than the gate metal layer, a change in the gate potential may result in a minute potential difference in the gate runner 53 below the gap 79. The minute potential difference below the gap 79 causes a time lag in transmission of a gate signal to the individual conductive portions 44 of two gate trench portions 40 separated from each other across the gap 79. As a result, current may concentrate at portions where turn-off is not completed, causing a turn-off breakdown. By designing width W2, which corresponds to the gap 79, not to be unnecessarily large, the potential difference below the gap 79 can be reduced sufficiently so that the turn-off breakdown is suppressed.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

10: semiconductor substrate, 11: well region, 12: emitter region, 14: base region, 15: contact region, 17: first gap, 18: drift region, 19: second gap, 20: buffer region, 21: upper surface, 22: collector region, 23: lower surface, 24: collector electrode, 30: dummy trench portion, 37: insulating film, 38: interlayer dielectric film, 38-1: interlayer dielectric film, 38-2: interlayer dielectric film, 38-3: interlayer dielectric film, 40: gate trench portion, 42: insulating film, 44: conductive portion, 46: dividing portion, 49: contact hole, 50: gate metal layer, 50-1: outer gate metal layer, 50-2: inner gate metal layer, 50-*a*: portion, 50-*b*: portion, 50-*c*: portion, 50-*d*: portion, 51: dummy gate metal layer, 51-1: outer dummy gate metal layer, 51-2: inner dummy gate metal layer, 51-3: inner dummy gate metal layer, 52: emitter electrode, 52-1: first region, 52-2: second region, 52-3: third region, 52-4: connecting region, 53: gate runner, 54: dummy gate runner, 55: gate pad, 56: voltage-supplying pad, 56-1: dummy gate pad, 56-2: Kelvin pad, 58: current sensing pad, 59: current sensing unit, 60: active section, 60-1: first region, 60-2: second region, 60-3: third region, 61: peripheral region, 62: outermost perimeter, 64: extending region, 66: first divided region, 68: second divided region, 70: transistor section, 72: contact hole, 74: contact hole, 75: contact hole, 76: contact hole, 77: contact hole, 79: gap, 80: diode section, 81: mesa portion, 82: cathode region, 89: wire, 90: temperature-sensing unit, 91: wire, 92: temperature-sensing wire, 93: longitudinal portion, 94: temperature-measurement pad, 96: sensor, 97: gate metal layer, 98: dummy gate metal layer, 99: dummy gate metal layer, 100: semiconductor device, 150: semiconductor device, 200: semiconductor device

What is claimed is:

1. A semiconductor device comprising:
a semiconductor substrate;
an active area provided in the semiconductor substrate and in which current flows between upper and lower surfaces of the semiconductor substrate, the active area comprising:
a first device region comprising a first plurality of transistor sections and a first plurality of diode sections alternately arranged in a horizontal array direction on the upper surface of the semiconductor substrate;
a second device region comprising a second plurality of transistor sections and a second plurality of diode sections alternately arranged in the horizontal array direction on the upper surface of the semiconductor substrate; and
a dummy gate metal layer surrounding the first device region and the second device region and forming a dividing region between the first device region and the second device region, the dummy gate metal layer separating the first device region from the second device region;
a gate metal layer electrically connected to a plurality of first gate trench portions in the first plurality of transistor sections and to a plurality of second gate trench portions in the second plurality of transistor sections to supply a gate voltage to the plurality of first gate trench portions in the first plurality of transistor sections and to the plurality of second gate trench portions in the second plurality of transistor sections;
a temperature-sensing unit provided on the active area;
a temperature-measurement pad arranged on the upper surface of the semiconductor substrate in a peripheral region between the active area and an outermost perimeter of the semiconductor substrate;
a temperature-sensing wire having a longitudinal portion extending in a predetermined longitudinal direction on the upper surface of the semiconductor substrate to an extending region that is an extension of the longitudinal portion of the temperature-sensing wire to the outermost perimeter of the semiconductor substrate in the longitudinal direction, the temperature-sensing wire connecting the temperature-sensing unit and the temperature-measurement pad;
a gate pad arranged on the upper surface of the semiconductor substrate in the peripheral region at a location other than in the extending region, the gate pad being electrically connected to the gate metal layer;
an emitter electrode provided on the upper surface of the semiconductor substrate in the first device region and the second device region; and
a dummy-gate pad arranged in the peripheral region, the dummy-gate pad being electrically connected to the dummy gate metal layer.

2. The semiconductor device according to claim 1, wherein
the gate pad and the dummy gate pad are arranged in a same one of two divided regions into which the peripheral region is halved by the longitudinal portion of the temperature-sensing wire and the extension of the longitudinal portion.

3. The semiconductor device according to claim 2, wherein the temperature-measurement pad is arranged in a second one of the two divided regions other than the same one of the two divided regions in which the gate pad and the dummy gate pad are arranged.

4. The semiconductor device according to claim 2, wherein
the gate metal layer comprises an outer gate metal layer arranged in the peripheral region, and an inner gate metal layer arranged on the active area and connected to the outer gate metal layer, and
the semiconductor device further comprises a gate runner containing a semiconductor material, provided on the semiconductor substrate in the active area, the gate runner having a first end connected to the inner gate metal layer and a second end connected to the inner gate metal layer or the outer gate metal layer.

5. The semiconductor device according to claim 2, further comprising a gate runner containing a semiconductor material, provided in a region between the active area and the peripheral region, and having first and second ends connected to the gate metal layer, wherein
in a direction connecting the first and second ends of the gate runner, a width between an end of the gate metal layer to which the first end of the gate runner is connected and an end of the gate metal layer to which the second end of the gate runner is connected is larger than a width of the gate metal layer connected to the first end of the gate runner.

6. The semiconductor device according to claim 1, wherein:
the gate metal layer surrounds the active area in top view of the semiconductor substrate; and
the dummy gate metal layer is provided inside the gate metal layer such that the gate metal layer surrounds the active area in top view of the semiconductor substrate.

7. The semiconductor device according to claim 1, further comprising:
a Kelvin pad provided in the same one of the two divided regions as the gate pad, the Kelvin pad being electrically connected to the emitter electrode.

8. The semiconductor device according to claim 1, wherein
the dummy gate metal layer comprises an outer dummy gate metal layer arranged in the peripheral region, and an inner dummy gate metal layer arranged on the active area and connected to the outer dummy gate metal layer, and
the semiconductor device further comprises a dummy gate runner containing a semiconductor material, provided on the semiconductor substrate in the active area, and having a first end connected to the inner dummy gate metal layer and a second end connected to the inner dummy gate metal layer or the outer dummy gate metal layer.

9. The semiconductor device according to claim 1, wherein the longitudinal direction of the temperature-sensing wire coincides with the array direction.

10. The semiconductor device according to claim 1, wherein the temperature-sensing unit is disposed between two of the first plurality of transistor sections.

11. The semiconductor device according to claim 1, wherein a part of the gate metal layer is provided along the temperature-sensing wire.

* * * * *